(12) United States Patent
Kondo et al.

(10) Patent No.: US 6,324,255 B1
(45) Date of Patent: Nov. 27, 2001

(54) X-RAY IRRADIATION APPARATUS AND X-RAY EXPOSURE APPARATUS

(75) Inventors: Hiroyuki Kondo, Tsukuba; Noriaki Kandaka, Kawasaki, both of (JP)

(73) Assignee: Nikon Technologies, Inc., Tokyo (JP)

( * ) Notice: Subject to any disclaimer, the term of this patent is extended or adjusted under 35 U.S.C. 154(b) by 0 days.

(21) Appl. No.: 09/372,596

(22) Filed: Aug. 12, 1999

(30) Foreign Application Priority Data

Aug. 13, 1998 (JP) .................................................. 10-228890
May 25, 1999 (JP) .................................................. 11-144947
May 27, 1999 (JP) .................................................. 11-148395

(51) Int. Cl.$^7$ ............................... H05G 2/00; G21K 5/00
(52) U.S. Cl. ........................................... 378/119; 378/143
(58) Field of Search .............................. 378/43, 119, 143, 378/124

(56) References Cited

U.S. PATENT DOCUMENTS

| | | | |
|---|---|---|---|
| 4,184,078 | * 1/1980 | Nagel et al. | 378/119 |
| 4,206,364 | * 6/1980 | Dixon et al. | 378/119 |
| 4,723,262 | * 2/1988 | Noda et al. | 378/143 |
| 5,045,696 | * 9/1991 | Hirose | 378/43 |
| 5,459,771 | * 10/1995 | Richardson et al. | 378/143 |
| 5,577,091 | * 11/1996 | Richardson et al. | 378/143 |
| 5,577,092 | * 11/1996 | Kublak et al. | 378/119 |
| 5,991,360 | * 11/1999 | Matsui et al. | 378/119 |
| 6,002,774 | * 12/1999 | Hertz et al. | 378/119 |

FOREIGN PATENT DOCUMENTS 0 858 249  8/1998 (EP) .
10-221499  8/1998 (JP) .

OTHER PUBLICATIONS

Berglund, M., et al., Cryogenic liquid–jet target for debris––free plasma soft x–ray generation, *Review of Scientific Instruments*, vol. 69, No. 6, pp. 2361–2364, Jun. 1998.

Rymell, L., et al., Debris–free single–line laser–plasma x–ray source for microscopy, *Applied Physics Letters*, vol. 66, No. 20, pp. 2625–2627, May 15, 1995.

\* cited by examiner

*Primary Examiner*—Drew Dunn
(74) *Attorney, Agent, or Firm*—Morgan, Lewis & Bockius LLP

(57) ABSTRACT

An x-ray irradiation apparatus and x-ray exposure apparatus provide improved x-ray generation. The x-ray irradiation apparatus includes a target material feed-out device to provide a target material in a feed-out direction to a specified target position and a laser to provide laser light to the specified target position to cause the target material to emit x-rays. In some configurations, an x-ray generation position control device may be used to determine and control a position of x-ray generation, a rotary mechanism may be operatively connected to the target material feed-out device to axially rotate the target material feed-out device about the feed-out direction, and/or a target feed-out control device may be used to detect and control the position of the target material feed-out device.

34 Claims, 10 Drawing Sheets

X-RAY IRRADIATION APPARATUS AND X-RAY EXPOSURE APPARATUS

This application claims the benefit of Application Nos. 10-228890, 11-144947 and 11-148395, filed in Japan on Aug. 13, 1998, May 25, 1999 and May 27, 1999, respectively, which are hereby incorporated by reference.

BACKGROUND OF THE INVENTION

1. Field of the Invention

The present invention relates to an X-ray irradiation apparatus such as an X-ray microscope, an X-ray analysis device, an X-ray exposure apparatus or the like, and more particularly, to an X-ray generating device in an X-ray irradiation apparatus.

2. Discussion of the Related Art

Laser plasma X-ray sources (or "LPX's") serve X-ray generating devices by focusing pulsed laser light on a target material placed inside a vacuum vessel so that the target material is converted into a plasma, and X-rays are generated from the plasma. Such LPX's have small sizes while having brightnesses comparable to those of undulators. As a result, such X-ray sources have attracted attention in recent years as light sources for X-ray equipment such as X-ray analysis devices and X-ray exposure apparatus, etc.

Generally, in X-ray irradiation systems using LPX's, X-rays radiated from the LPX are directed onto the object of irradiation, such as a sample in an X-ray microscope or X-ray analysis device or a mask in an X-ray exposure apparatus, using an illumination optical system. The transmitted or reflected light is then focused on a detector or object of exposure, such as a substrate coated with a resist, by an image-focusing optical system. In conventional X-ray optical systems, once the alignment of the X-ray light source position and X-ray optical elements has been completed, no further adjustment is performed. However, long-term operation of LPX's introduces a number of difficulties that must be addressed.

First, the position of the X-ray source should not fluctuate from a specified position. Fluctuation in the position of X-ray generation may occur when the target material is replaced. Furthermore, fluctuation in the X-ray generation position over time occurs as a result of variations in the beam divergence and direction of emission of the laser light caused by changes in the temperature of the laser rod and changes in the temperature of the crystal used for the generation of second harmonics of the laser light. In addition, the position of X-ray generation may also fluctuate as a result of variations in the target position caused by deformation of the target holding member as a result of stray particles emitted in the vicinity of plasma generation.

In an X-ray microscope, if the X-ray light source position fluctuates greatly, the sample illumination also shifts so that the area to be observed is no longer in the field of view. Furthermore, in the case of multiple exposures, even a slight fluctuation in the position of the X-ray source causes the sample illumination position to spread. Consequently, the X-ray dosage per unit area of the sample is reduced as compared to cases having no fluctuation in the position of the light source, thereby increasing the amount of required X-ray irradiation.

In an X-ray exposure apparatus, if the X-ray light source position shifts over time, the position on the mask illuminated by the X-rays also shifts. As a result, IC patterns cannot be accurately transferred.

Second, to achieve stable long-term operation, a continuous supply of target material must be provided. It is also preferable to be able to recover and reutilize the target material, especially if the target material is expensive. That is, the recovery and reutilization of the target material can lower the running costs of the apparatus. Therefore, target materials are used in the form of gases, liquids or fine solid particles. Target materials in such forms are fed out into the vacuum vessel from a target material feed-out portion, such as a nozzle, and then irradiated with laser light to generate X-rays.

Conventional methods use a substance that is a gas at room temperatures as the target material (for example, nitrogen, carbon dioxide, krypton or xenon). The target material is sprayed or jetted from a nozzle after which the target material gas or cluster form material resulting from the adiabatic expansion of the gas is irradiated with laser light. Since the target material is a gas at room temperatures, there is no deposition of this target material on optical elements. As a result, a gaseous target material is favorable because no deterioration occurs in the performance of the optical elements.

The gas sprayed from the nozzle expands inside the vacuum vessel as a result of free expansion. Consequently, the density of the gas decreases abruptly as the distance from the nozzle increases. Accordingly, if it is desired to increase the quantity of X-rays emitted from the plasma, it is necessary to generate the plasma in the vicinity of the nozzle where the density of the gas (or cluster form material) is large (i.e., within a distance of several tenths of a mm to several mm from the tip end of the nozzle).

If a liquid is used as the target material, the liquid is continuously sprayed from the nozzle or sprayed from the nozzle in the form of liquid droplets, and these droplets are irradiated with laser light. If fine solid particles are used as the target material, the fine solid particles are sprayed together with a gas. These fine particles are then irradiated with laser light. Also, irradiation with laser light is performed in the vicinity of the nozzle, where the positional stability of the target material is high.

Moreover, if X-rays are generated over a long period of time using the conventional X-ray generating device with a gas target material, a drop in X-ray intensity will be encountered. Furthermore, with long-term X-ray generation using a conventional X-ray generating device having a solid or liquid target material, the X-ray intensity becomes unstable.

SUMMARY OF THE INVENTION

Accordingly, the present invention is directed to an X-ray irradiation apparatus and X-ray generating device that substantially obviates one or more of the problems due to limitations and disadvantages of the related art.

An object of the present invention is to provide a system that generates X-rays in a stable manner.

Another object of the present invention is to provide an X-ray irradiation apparatus and an X-ray generating device that reduces or eliminates fluctuation in the X-ray irradiation position occurring after replacement of the target material or caused by the effects of long-term operation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an x-ray irradiation apparatus includes a target material feed-out device to provide a target material to a specified target position; a laser to irradiate the specified target position with laser light so that the target material forms a plasma that emits x-rays; and an x-ray generation position control device to determine and control a position of x-ray generation.

In another aspect, an x-ray irradiation apparatus includes a target material feed-out device to provide a target material in a feed-out direction to a specified target position; a laser to provide laser light to the specified target position, the laser light causing the target material to emit x-rays; and a rotary mechanism operatively connected to the target material feed-out device to axially rotate the target material feed-out device about the feed-out direction.

In another aspect, an x-ray irradiation apparatus includes a target material feed-out device to provide a target material in a feed-out direction to a specified target position; a laser to provide laser light to the specified target position, the laser light causing the target material to emit x-rays; and a target feed-out control device to detect and control the position of the target material feed-out device.

In another aspect, an x-ray exposure apparatus for exposing a mask pattern of a mask onto a substrate includes a target material feed-out device to provide a target material to a specified target position; a laser to irradiate the specified target position with laser light so that the target material forms a plasma that emits x-rays; an x-ray generation position control device to determine and control a position of x-ray generation; and an x-ray optical system to direct the x-rays to the substrate via the mask such that the mask pattern is exposed onto the substrate.

In another aspect, an x-ray exposure apparatus for exposing a mask pattern of a mask onto a substrate includes a target material feed-out device to provide a target material in a feed-out direction to a specified target position; a laser to provide laser light to the specified target position, the laser light causing the target material to emit x-rays; a rotary mechanism operatively connected to the target material feed-out device to axially rotate the target material feed-out device about the feed-out direction; and an x-ray optical system to direct the x-rays to the substrate via the mask such that the mask pattern is exposed onto the substrate.

In another aspect, an x-ray exposure apparatus for exposing a mask pattern of a mask onto a substrate includes a target material feed-out device to provide a target material in a feed-out direction to a specified target position; a laser to provide laser light to the specified target position, the laser light causing the target material to emit x-rays; a target feed-out control device to detect and control the position of the target material feed-out device; and an x-ray optical system to direct the x-rays to the substrate via the mask such that the mask pattern is exposed onto the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the preferred embodiments of the present invention, examples of which are illustrated in the accompanying drawings.

X-Ray Generation Position Control Device

Figure 1:
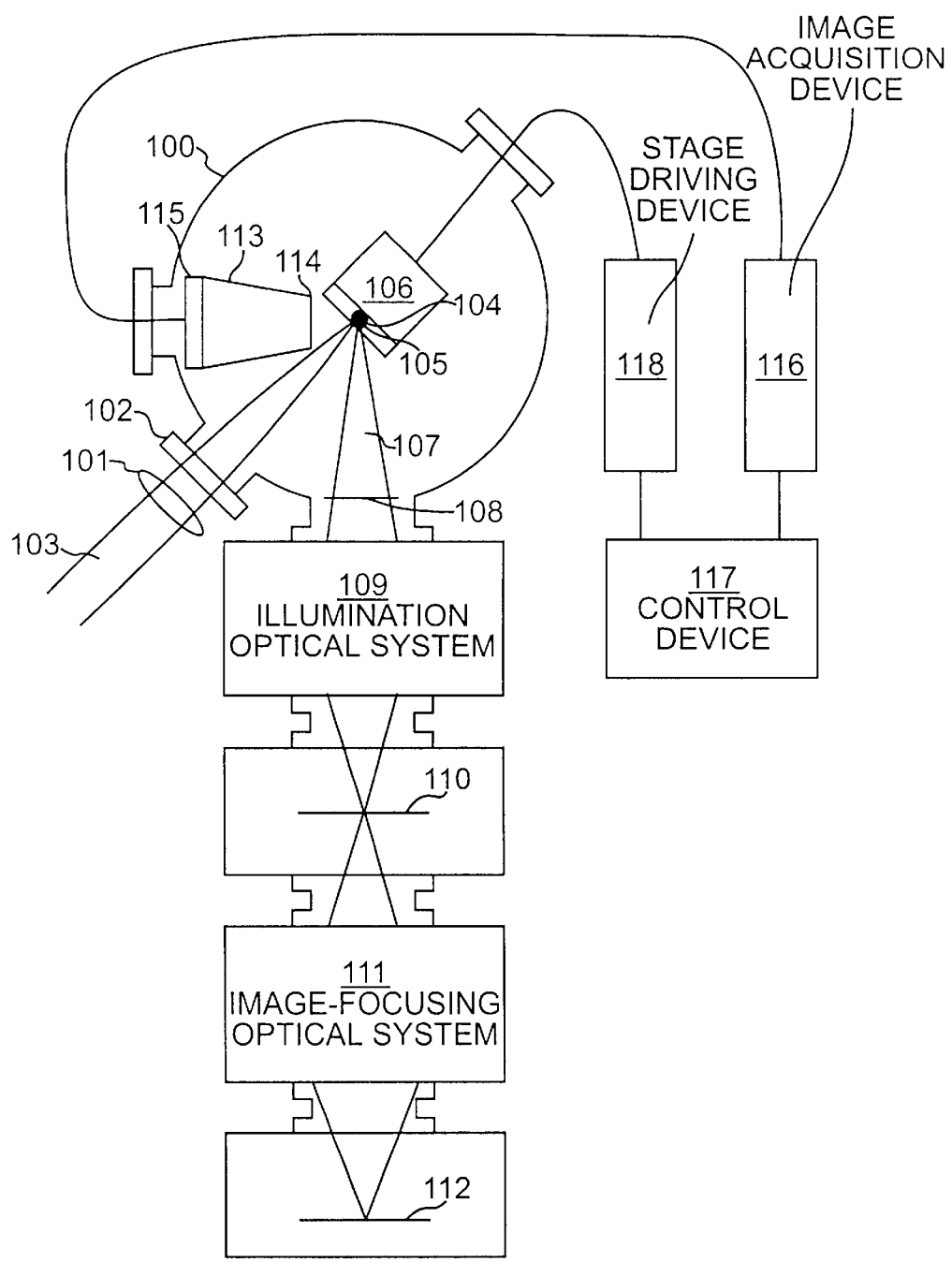
FIG. 1 is a schematic diagram showing an X-ray projection exposure apparatus utilizing an X-ray irradiation apparatus according to one exemplary configuration of the present invention.

According to one aspect of the present invention, an X-ray generation position control device maintains the X-ray generation position at a specified position. FIG. 1 is a schematic diagram showing an X-ray projection exposure apparatus utilizing an X-ray irradiation apparatus according to a configuration of the present invention. In FIG. 1, the X-ray projection exposure apparatus comprises vacuum vessel 100, a lens 101, a window 102 for laser light 103, a target 104 to form a plasma 105, a target moving stage 106, a visible-light-cutting X-ray-transmitting filter 108 to pass X-rays 107, an illumination optical system 109, a mask 110, an image-focusing optical system 111 to project X-rays 107 on to a resist 112, an X-ray pinhole camera 113 having a pinhole 114, a CCD 115, an image acquisition device 116, a control device 117, and a stage driving device 118.

The interior of the vacuum vessel 100 is evacuated by a vacuum pump (not shown) to a pressure, thereby allowing the laser light 103 to reach the target 104 without discharging in the air and insuring sufficiently small absorption of the X-rays 107 radiated from the plasma 105. The laser light 103 passes through the window 102 and is focused on the surface of the target 104 by the lens 101, thereby generating plasma 105. The target 104 is disposed on a target moving stage 106 which can be moved along three mutually perpendicular axes. Some of the X-rays 107 among the X-rays generated from the plasma 105 pass through the visible-light-cutting X-ray-transmitting filter 108 (for example, a Be film which is one example of an X-ray optical element) and are then directed onto the mask 110 via the illumination optical system 109. The X-rays passing through the mask 10 are caused to form an image of the mask pattern on the resist 112 using image-focusing optical system 111. In this manner, the X-rays 107 expose the resist 112.

The X-ray pinhole camera 113 is disposed in a direction that is symmetrical to the direction of the optical axis of the X-ray optical system with respect to the normal of the target 104. Generally, the shape of the plasma and the angular distribution of the X-ray intensity in a laser plasma X-ray source are symmetrical with respect to the normal of the target. Accordingly, if such an arrangement is used, the shape of the plasma and the X-ray intensity distribution are generally the same as those seen from the direction of the optical axis of the X-ray optical system, although left and right are reversed. In one configuration, a pinhole 114 of the pinhole camera 113 has a diameter of 10 $\mu$m. Of course, other pinhole cameras or imaging structures can be utilized.

A CCD 115 for soft X-ray use detects the plasma image. CCD's for soft X-ray use are generally sensitive to both visible light and ultraviolet light. However, if the pinhole diameter is set at approximately 10 $\mu$m, the scattered laser light, visible light, and ultraviolet light emitted from the plasma will be diffracted by the pinhole, resulting in a conspicuous drop in intensity so that the visible and ultraviolet components are not detected by the CCD.

In the output image of the CCD 115, an image for each laser shot, or an image accumulated over a specified number of laser shots, is received by the image acquisition device 116 to be stored in a memory therein. The image acquisition device 116 is connected to the control device 117 (e.g., a personal computer), and the system is arranged so that the CCD output images acquired by the image acquisition device 116 are transmitted to the control device 117.

In the control device 117, the position of the X-ray source is determined from the CCD images. In determining the position of the X-ray source, the brightest pixel in the CCD output image may simply be taken as the position of the X-ray source. Alternatively, the center-of-gravity position of the brightness may be determined from the brightness values of the respective pixels, and this position may be taken as the position of the X-ray source. Another alternative for the position of the X-ray source is the center position or center-of-gravity position of a group of pixels exceeding a certain threshold value.

If the position of the X-ray source thus determined falls outside a specified permissible range, or if the frequency with which the position of the X-ray source falls outside this permissible range exceeds a specified value, a signal is sent out from the control device 117 so that the target moving stage 106 is moved using the stage driving device 118, thereby moving the target 104 on the target moving stage 106. As a result, the position of the X-ray source is relocated within the permissible range.

The region from which X-rays are radiated differs according to the wavelength of the X-rays. Generally, short-wavelength X-rays are radiated from a high-temperature region that is smaller than the region from which long-wavelength X-rays are radiated. Accordingly, in order to monitor the position of the X-ray source of the wavelength actually used, it is desirable that a filter, which passes a wavelength region that is the same as or close to the wavelength region being used, be installed in front of the CCD. For example, if X-rays in the "water window" region ($\lambda$=2.3~4.4 nm) are used, it is sufficient to install a titanium film with a thickness of approximately 0.5 $\mu$m in front of the CCD. The transmission region of titanium with a thickness of approximately 0.5 $\mu$m is approximately 2.7 to 5 nm. Therefore, X-rays located substantially in the "water window" region will be observed.

X-rays with a wavelength of 13 nm have become popular for use in X-ray reduction exposure systems. Thus, silicon (Si) may be used as a filter because silicon has an absorption edge at 12.4 nm and has a high transmissivity for X-rays of longer wavelength than 12.4 nm. For example, the transmission region of an Si film with a thickness of 1 $\mu$m is approximately 12 to 15 nm. Such filters for limiting the wavelength region may be constructed from a single substance, or may be constructed from a plurality of substances. Furthermore, a multi-layer film mirror may be used so that only specified X-rays are observed.

In the configuration described above, a CCD for soft X-ray use has been described. However, a visible-light CCD may alternatively be used. In such a case, after the X-ray image is detected by a micro-channel plate equipped with a fluorescent surface, the X-ray image is converted into a visible-light image to be detected by a visible-light CCD.

In addition to X-rays, visible light is also emitted from the plasma. This visible light is emitted from a region that is broader than the region in which X-rays are generated. However, the brightest position in this region more or less coincides with the position of X-ray generation. Accordingly, the position of X-ray generation may also be determined using visible light emitted from the plasma. In this case, a magnifying optical system (microscope) is incorporated, and detection may be performed by the CCD after the light intensity is sufficiently filtered so that the CCD will not be saturated. If the plasma position is thus detected using visible light, a lens optical system can be used. Accordingly, the plasma image can be observed at a high magnification, thereby enabling the plasma position to be determined more accurately.

Furthermore, visible-light CCD's are less expensive than soft X-ray CCD's, thereby lowering the cost of the apparatus.

Observation of the plasma generation position may be performed constantly, or may be performed intermittently at certain specified time intervals. For example, if it is known beforehand that the plasma position will not show any great deviation in a short time, the plasma position may be measured only when the target is replaced and subsequently at fixed time intervals (e.g., every few hours). If observation is performed intermittently, clogging of the pinhole by debris emitted from the LPX can be prevented and deposition of such particles to the CCD can be reduced by installing a shutter in front of the pinhole camera. This shutter is closed when the plasma position is not being observed, thereby reducing damage to the CCD by soft X-rays.

Figure 2:
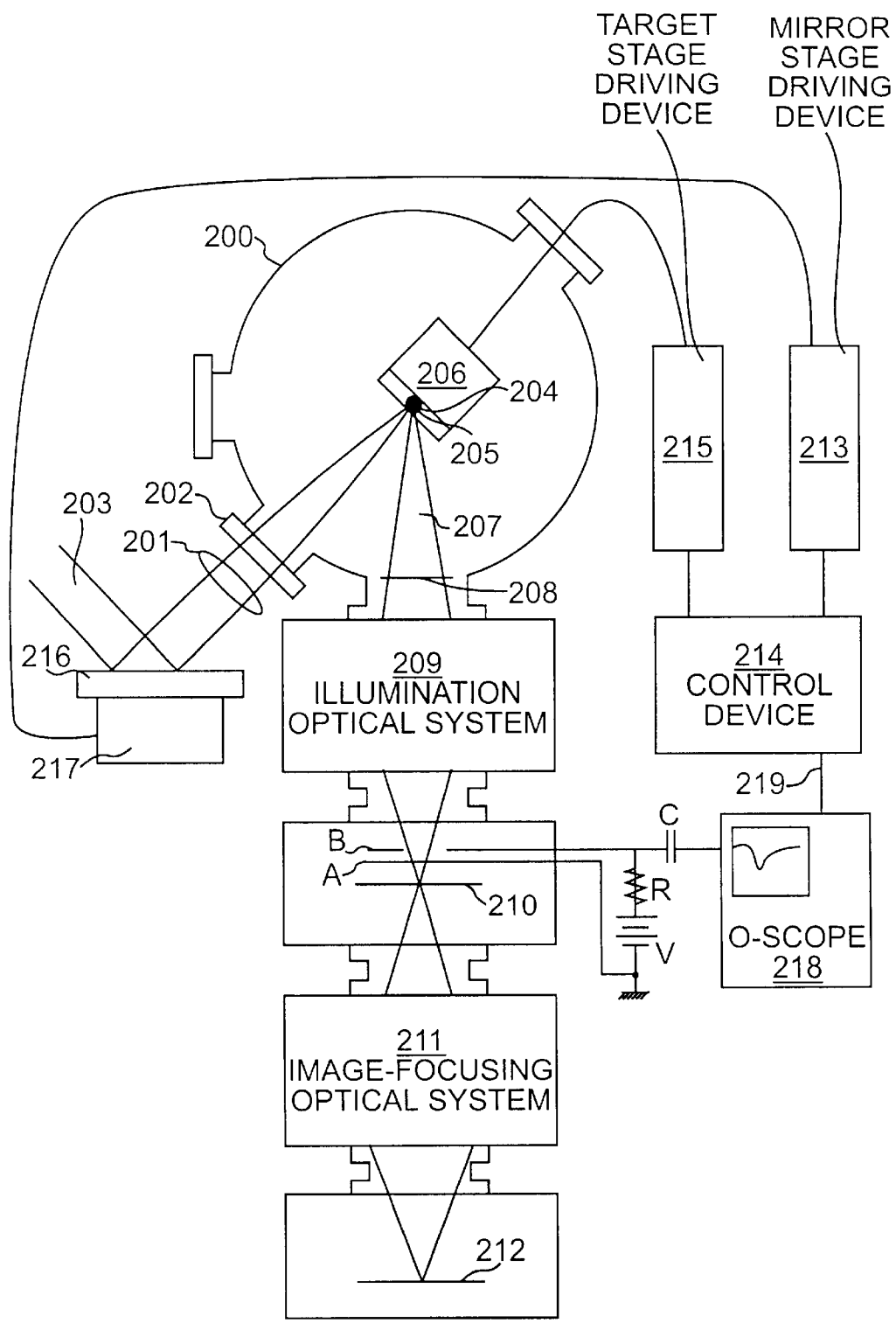
FIG. 2 is a schematic diagram illustrating an X-ray projection exposure apparatus utilizing an X-ray irradiation apparatus according to another exemplary configuration of the present invention.

FIG. 2 is a schematic diagram illustrating an X-ray projection exposure apparatus utilizing an X-ray irradiation apparatus according to another configuration of the present invention. The X-ray exposure apparatus of FIG. 2 comprises a vacuum vessel 200, a lens 201, a window 202 for laser light 203, a target 204 to generate a plasma 205, a target moving stage 206, a visible-light-cutting X-ray-transmitting filter 208 to pass X-rays 207, an illumination optical system 209, a mask 210, an image-focusing optical system 211 to expose a resist 212, a mirror stage driving device 213, a control device 214, a target stage driving device 215, a mirror 216, a mirror stage 217, a digital oscilloscope 218, a GPIB cable 219, electrodes A and B, a resistance R, and a coupling capacitor C.

In a manner similar to that described with reference to FIG. 1, the interior of the vacuum vessel 200 of FIG. 2 is evacuated by a vacuum pump (not shown) to a pressure that allows the laser light to reach the target without discharging in the air and insures a sufficiently small absorption of the X-rays radiated from the plasma. After being reflected by the mirror 216 on the mirror stage 217, the laser light 203 passes through the window 202 and is focused on the target 204 by the lens 201, thereby generating plasma 205. The target 204 is disposed on the surface of the target moving stage 206 to be moveable along three mutually perpendicular axes using the stage 206. Some of the X-rays 207 among the X-rays generated from the plasma 205 pass through the visible-light-cutting X-ray-transmitting filter 208 (a Be film is one example of an X-ray optical element) and are directed onto the mask 210 via the illumination optical system 209. The X-rays passing through the mask 210 expose the resist 212, thereby forming an image of the mask pattern on the resist 212 via the image-focusing optical system 211.

A pair of electrodes A and B having openings are disposed on the optical axis of the image-focusing optical system 209 near the focal point of the image-focusing optical system 209 (i.e., in the vicinity of the mask). The electrode A is grounded and a positive voltage (such as approximately 100 V) is applied to the electrode B via the resistance R. The electrode B is connected to a current measuring device via the coupling capacitor C so that the amount of current flowing between the electrodes A and B or the amount of charge flowing between the electrodes A and B can be detected. An oscilloscope, current integrator, or the like, can be used as the current measuring device. In the example of FIG. 2, a digital storage oscilloscope 218 is used. Preferably, the digital storage oscilloscope 218 has a small input impedance, such as 50 ohms.

When an X-ray beam strikes the electrode A, photoelectrons are emitted from the surface of the electrode A as a result of the photoelectric effect. Since an electric field is applied across the electrodes A and B, the photoelectrons emitted from the electrode A are accelerated toward the electrode B and collected. That is, an electric current flows between the electrodes A and B. If the X-ray source is a pulsed X-ray source, such as an LPX, the pulse current flowing between the electrodes A and B passes through the coupling capacitor C and into the digital oscilloscope 218 so that the waveform of the current flowing between the electrodes A and B is displayed on the screen of the digital storage oscilloscope 218. This current waveform is input into the control device 214 via the GPIB cable 219.

If the position of the X-ray source is in the specified location, the X-ray beam passes through the opening part of the electrode A, and either does not strike the electrode or strikes the electrode only very slightly. However, if the position of the X-ray source is shifted so that the optical axis of the illuminating light is shifted, the X-ray beam misses the opening in the electrode A and strikes the electrode. When X-rays strike the electrode A, the number of photoelectrons emitted increases so that the strength of the signal displayed on the oscilloscope is increased.

When the photoelectron signal strength increases beyond a specified value during operation of the LPX, a signal is generated to indicate that there has been a shift in the X-ray source position. Accordingly, the control device 214 drives the mirror stage driving device 213 so that the photoelectron signal strength is minimized, thereby causing the mirror stage driving device 213 to move or alter the angle of the mirror 216 via the mirror stage 217. As a result, the position of the plasma 205 is altered. Alternatively, the target stage driving device 215 is driven so that the target moving stage 206 is moved, thereby altering the position of the target 204 disposed on the stage 206.

A substance that readily emits photoelectrons when struck by the X-ray beam is suitable as the material of the electrode A. For example, a metal or a substance with a metal plating on the surface is desirable. The shape of the openings in the electrodes A and B is not limited to a round shape. That is, any desired shape such as a triangular, square, linear or circular arc shape may be used.

The photoelectron signal strength has been described to monitor the deviation of the X-ray beam. However, it would also be possible to perform a time integration of the current waveform input into the oscilloscope and to use the amount of charge (i.e., number of photoelectrons) as an indicator. Furthermore, a digital storage oscilloscope 218 has been described as a current measuring device. However, a current integrator or other suitable device may be used. If a current integrator is used, the integration interval of the current integrator is set at the time for which a photoelectron current is flowing or at a somewhat longer time. By thus limiting the integration interval, it is possible to reduce any increase in the background intensity or saturation of the current integrator by dark current.

Moreover, a pulsed X-ray source has been described as the X-ray source. However, if a continuous X-ray source, such as synchrotron radiant light, is used, the current flowing between the electrodes A and B can be monitored with an ammeter having a current value to be input into the control device. The position at which the electrodes are inserted is not limited to the vicinity of the mask 210 but may be any desired position such as the vicinity of the resist 212 or other suitable position. Also, an X-ray exposure apparatus has been described as an example. However, in an X-ray microscope or X-ray analysis device, the electrodes may be inserted in the vicinity of the sample.

The system, as described, has been designed so that both the focal position of the laser and the target position can be varied in order to alter the position of plasma generation. However, it would also be possible to design the system so that only one of these values is varied.

Figure 3:
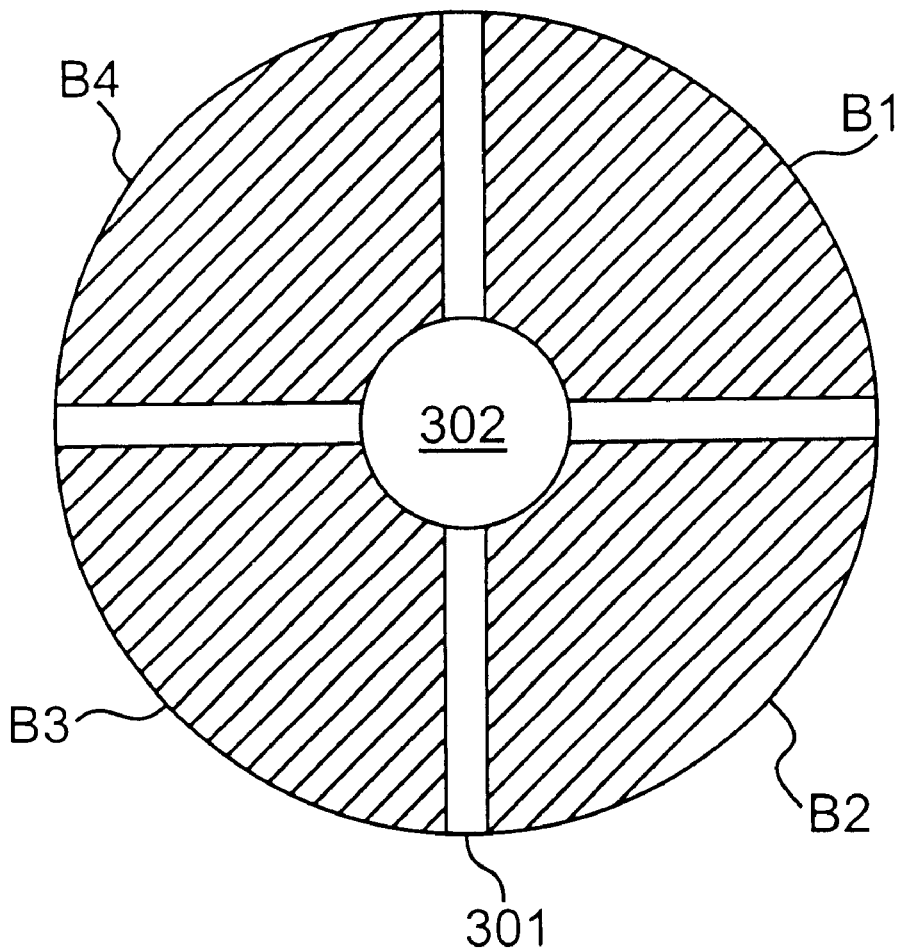
FIG. 3 is a diagram showing an example of one of the electrodes used in an X-ray generation position detector according to a configuration of the present invention.

The electrode structure of the type described above, can detect if a shift in the position of the X-ray source has occurred. However, the direction of this shift is not readily known. As a result, additional time is required to correct the position of the X-ray source. To remedy such, as shown in FIG. 3, the electrode on the side that does not receive X-rays (electrode B) can be split into a plurality of partial electrodes (for example, four partial electrodes B1, B2, B3 and B4) such that a current measuring device is attached to each of the partial electrodes and the outputs of the respective current measuring devices is input into the control device. FIG. 3 is seen from the side of the electrode A. Here, the surface of an insulating substrate 301 (e.g., a ceramic) is coated with a metal (e.g., gold) to form the electrodes B1 through B4.

Here, the current signal from the electrode directly above the portion of the electrode A, which has the largest area struck by the X-ray beam, will be the largest signal. Accordingly, the direction in which the X-ray beam has shifted can be easily ascertained. In the example of FIG. 3, the electrode is split into four parts. However, if the electrode is split into an even greater number of parts, the direction of the shift of the X-ray beam can be ascertained with greater accuracy. With a pulsed X-ray source, it becomes difficult to use an oscilloscope as the current measuring device when the number of electrodes is increased. Accordingly, it is more desirable to use a current integrator.

In FIG. 3, the electrode on the side not receiving X-rays (i.e., electrode B) is split. However, it is also possible to split the electrode on the side receiving X-rays (i.e., electrode A) or to split both electrodes. If the electrode on the side receiving X-rays (i.e., electrode A) is split, current flows only in portions struck by X-rays digressing from the optical axis. Accordingly, the direction in which the X-ray beam has shifted can be ascertained with greater accuracy.

As has been described above, an X-ray irradiation apparatus focuses laser light on a target material inside a vacuum vessel so that this target material is converted into a plasma. An object of irradiation is accordingly irradiated with X-rays radiated from the plasma. The apparatus provides an X-ray generation position control device that controls the X-ray generation position to remain at a specified position. That is, control is performed by an X-ray generation position control device so that the position of X-ray generation is maintained at a constant position during the use of the X-ray irradiation apparatus. Accordingly, fluctuation in the X-ray irradiation position occurring after the replacement of the target material or caused by long-term operation can be reduced or eliminated.

The position of X-ray generation is controlled to a target value by driving a target material moving device or a target material feed-out device moving device so that the position where the laser light strikes the target is varied on the target material. A device such as a three-dimensional stage or other suitable device may be used as the target material moving device or target material feed-out device moving device.

The position of X-ray generation is controlled to a target value using a laser irradiation position control device to vary the irradiation position of the laser light that is directed onto the target substance. Methods for varying the irradiation position of the laser light include varying the angle of a laser light reflecting mirror or a plate glass member inserted into the light path, or other suitable technique.

Because a two-dimensional detector is used, deviations of the position of X-ray generation in X and Y directions can be simultaneously measured so that there is no need to install separate detectors for the respective directions. An example of a two-dimensional detector is a two-dimensional CCD. If such a sensor is used, an image of the X-rays is focused on the sensor using a pinhole camera, image-focusing optical system, or the like. It is desirable that the two-dimensional detector be sensitive to the X-ray wavelength used. However, a detector which is only sensitive to the region extending from the visible-light region to the ultraviolet region may also be used. Not only X-rays, but also visible light and ultraviolet light, are emitted from the plasma. Such visible light and ultraviolet light are emitted from a broader spatial region than the region in which X-rays are generated. However, the brightest position in images of the plasma taken in visible light or ultraviolet light generally coincides with the X-ray generation position. Accordingly, the position of X-ray generation can be estimated even if a two-dimensional detector that is only sensitive to the visible-light region or ultraviolet region is used.

If the X-ray generation position detector is positioned on the light path of the X-rays directed onto the target irradiation or in the vicinity of the light path, the shape of the X-ray light source and the magnitude of the deviation in the position of the light source as seen from the detector will be the same as those seen from the surface that is actually exposed. Accordingly, the position of X-ray generation can be accurately detected.

The position of X-ray generation can be determined from information regarding the brightness of the X-ray source. For example, the position with the highest intensity may be determined as the position of X-ray generation, or the center-of-gravity position of the intensity may be determined as the position of X-ray generation, etc. Furthermore, this can also be used to monitor the cumulative amount of exposure on the object of exposure (e.g., a resist) in cases of exposure by multiple irradiation.

The position of the X-rays emitted from the plasma differs according to the wavelength of the X-rays. Accordingly, if the system is designed so that the wavelength of the X-rays to be utilized, or a specified wavelength region including the wavelength of the X-rays to be utilized, can be selected and observed, the size and position of the region from which the X-rays to be utilized are emitted can be accurately determined.

The system, as described above, enables monitoring of the position of the X-ray source and correction of the position without stopping operation of the exposure apparatus. This system therefore, is convenient. If the operation of the exposure apparatus can be stopped temporarily, a CCD can be inserted in the electrode position in FIG. 2, and the position of the X-ray source can be monitored at certain specified times.

If the position of plasma generation is detected using an X-ray light quantity measurement function such as with a CCD, the amount of X-ray exposure on the resist can be calculated or predicted. Accordingly, the object of exposure (e.g., resist) can be irradiated with the optimal amount of exposing light.

In the configurations described above, the target substance was attached to a moving stage. If the target substance includes solid particles, liquid droplets, a liquid column, a gas, or a cluster and the target feed-out device is separated from the target irradiating position of the laser light, the target position may be altered by altering the position of the target feed-out device (e.g., nozzle).

X-rays are transmitted via the central openings of electrodes. If the position of X-ray generation is normal, the X-rays pass through the opening parts, and the conductors are not irradiated. When the position of X-ray generation is abnormal, one of the conductors is irradiated by the X-rays, so that photoelectrons are emitted as a result of the photoelectric effect. If a voltage is applied across the electrodes, these photoelectrons are attracted to the other electrode so that a current flows between the electrodes. Accordingly, the fact that the position of X-ray generation is abnormal can be detected. When the split conductors are used as separate electrodes, the direction in which the position of X-ray generation is shifted can be ascertained by detecting the current values flowing through the respective electrodes.

As a result of the advantages provided by such configurations of the present invention, the X-ray generation position can be monitored and fixed at a specified position. Accordingly, fluctuations in the plasma position caused by changes in the target material position when the target material is replaced, fluctuations in the plasma position over long-term operation, and deformations of the target holding member caused by debris emitted from the plasma generation can be eliminated or reduced. Moreover, discrepancies in the observation position and illumination position are eliminated, thereby enabling the sample to be accurately observed and IC patterns to be accurately transferred. Furthermore, because the amount of cumulative X-ray exposure on the object of exposure can be calculated or predicted, exposure can be performed using the optimal amount of exposing light.

Target Material Feed-Out Portion

Since gas caused to jet from a nozzle into a vacuum vessel expands as a result of free expansion, the density of the gas decreases abruptly as the distance from the nozzle increases. Therefore, to increase the quantity of X-rays emitted from the plasma, it is necessary to generate the plasma in the vicinity of the nozzle (i.e., in a position ranging from several tenths of a millimeter to several millimeters from the tip end of the nozzle), where the gas (cluster) density is large. If the plasma is generated in the vicinity of the nozzle, electrons or high-velocity atoms and ions emitted from the plasma collide with the nozzle and members located in the vicinity of the nozzle causing abrasion. When the generation of X-rays is continued over a long period of time, the tip end portion of the nozzle is abraded away, so that the gap between the tip end portion of the nozzle and the area irradiated by laser light gradually increases. As a result of this, the gas (cluster) density in the laser irradiation area drops, thereby decreasing the X-ray intensity.

Figure 5A:
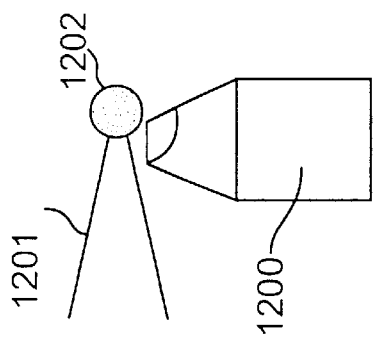
FIGS. 5A–5D are diagrams showing examples of the shape of the target material feed-out portion showing abrasion following long-term operation of an LPX.
Figure 5B:
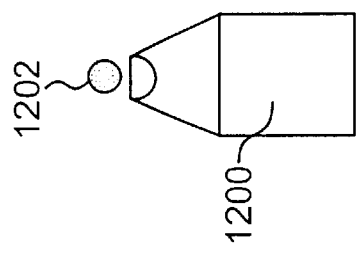

Similarly, if the position of plasma generation is shifted in the direction of the laser focusing lens, instead of being located directly above the nozzle, the tip end of the nozzle will not be uniformly abraded away. Instead, the portion closer to the plasma will be abraded to a greater extent. A schematic view of the nozzle shape following $10^7$ shots of laser irradiation in a case where the plasma is generated on the side of the focusing lens is shown in FIG. 5A and a schematic view of the nozzle shape following laser irradiation when the plasma is generated on the opposite side is shown in FIG. 5B. In these figures, the fine lines indicate the nozzle shape prior to laser irradiation, while the heavy lines indicate the nozzle shape following $10^7$ shots of laser irradiation. As shown, the position of plasma generation by the laser light 1201 is shifted in the direction of the optical axis of the laser. However, the tip end of the nozzle 1200 is similarly abraded away in a non-uniform manner if the plasma 1202 is shifted in the direction perpendicular to the optical axis of the laser.

Figure 5C:
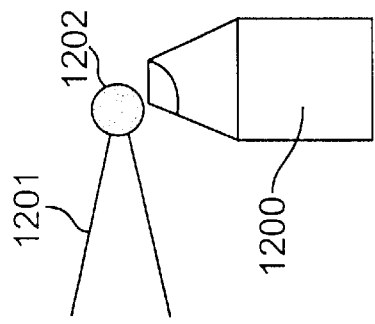
Figure 5D:
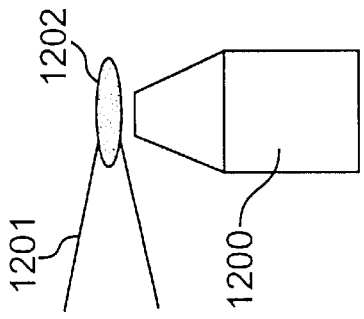

Furthermore, the abrasion of the tip end of the nozzle 1200 is also affected by the shape of the plasma 1202 that is generated by the laser light 1201, as shown in FIGS. 5C and 5D. Here, the plasma is produced in the form of a filament in the direction of the optical axis of the laser. FIG. 5C is a view from the direction perpendicular to the optical axis of the laser, and FIG. 2D is a view from the direction of the optical axis of the laser. Furthermore, the fine lines indicate the nozzle shape prior to laser irradiation, while the heavy lines indicate the nozzle shape following $10^7$ shots of laser irradiation.

When the tip end of the nozzle is abraded asymmetrically, the direction of the gas (cluster) jet changes so that the gas (cluster) density at the focal position of the laser changes. As a result, the X-ray intensity and the position of X-ray generation fluctuates.

Furthermore, variation in the shape of the nozzle tip alters the conditions of cluster formation, thereby shifting the conditions from optimum cluster formation and causing a drop in the X-ray intensity. In systems using liquid or fine particle target materials, the same phenomena occur so that the tip end of the nozzle of the target material feed-out portion is abraded away. As a result, the feed-out direction of the target material changes the positional stability of the target as the laser light irradiation position deteriorates, thereby causing the X-ray intensity to become unstable.

Accordingly, because the nozzle tip after long-term operation is abraded so that the shape differs from the initial shape, frequent nozzle replacement is necessary. However, in a conventional X-ray generating device, the laser light focal position and the position of the nozzle must be re-adjusted manually when the nozzle is replaced. Accordingly, such a procedure is inefficient, and does not provide a practical solution to the above-described problems.

Thus, in a second aspect of the present invention, the tip end of the target material feed-out portion is made to uniformly or symmetrically abrade away. Generally, the system is devised so that the tip end of the target material feed-out part is uniformly or symmetrically abraded as a result of the provision of a mechanism which causes the target material feed-out portion to rotate. Consequently, the feed-out direction of the target material is stabilized, and the positional stability of the target is improved. In addition, in cases where a gas or cluster is used as the target material, variations in the density of the target material at the laser focal position can be reduced so that X-rays can be stably extracted over a long period of time.

According to the second aspect of the present invention, an improved target material feed-out portion is provided. An exemplary configuration of a target material feed-out portion according to the present invention will be now described with reference to FIG. 6.

Figure 6:
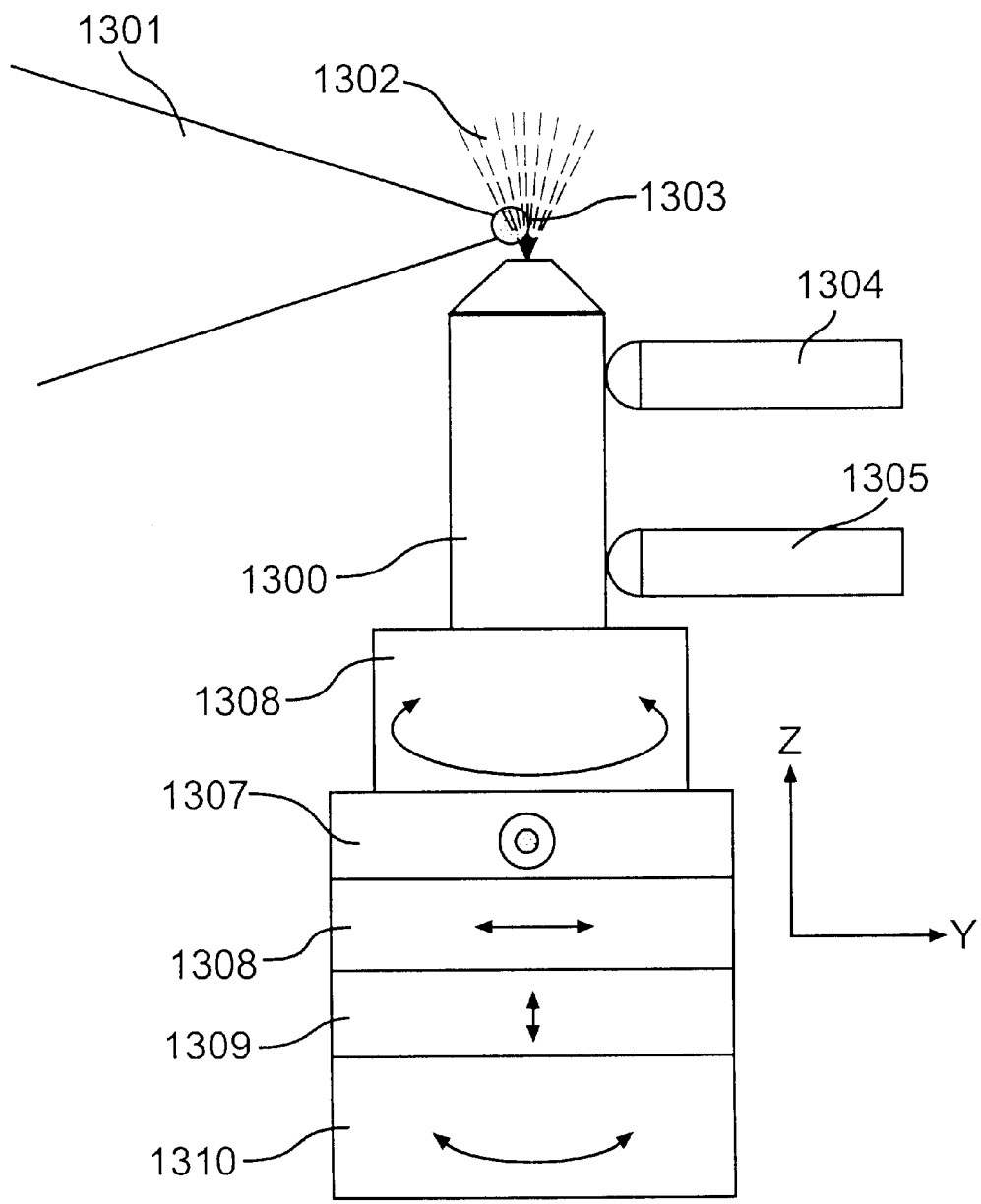
FIG. 6 is a schematic diagram showing the vicinity of the target material feed-out portion of the X-ray generating device of the present invention.

In FIG. 6, a nozzle 1300 functions as the target material feed-out portion. A gas target material 1302 jets into a vacuum vessel (not shown) from the nozzle 1300. The direction of the jet of the target material 1302, as shown in FIG. 6, is from the bottom of the page upward. Thus, gas jets into the vessel and rapidly cools as a result of adiabatic expansion. In some portions of the gas, the molecules (or atoms) adhere to each other as a result of Van der Waals forces to form clusters. Pulsed laser light 1301 is focused directly above the nozzle 1300 near the tip end of the nozzle by a focusing lens (not shown). The plasma 1303 is generated at a position offset toward the focusing lens from the area directly above the nozzle.

Contact needle type displacement sensors 1304, 1305 are attached to the side surface of the nozzle 1300 in two places, and the inclination of the nozzle 1300 is measured. A rotating stage 1306 is attached to the lower portion of the nozzle 1300 so that axial rotation of the nozzle 1300 about the direction of the gas jet is possible. Tri-axial linear stages 1307, 1308, 1309 for the X, Y and Z directions are attached underneath so that these stages are perpendicular to each other. Furthermore, a gonio-stage 1310 is attached still further below so that the inclination of the nozzle 1300 can be adjusted.

The outputs of the displacement sensors 1304, 1305 are input into the central processing unit (such as a personal computer or the like), and, if the inclination of the nozzle exceeds a permissible amount, the gonio-stage 1310 is driven so that the inclination of the nozzle 1300 is restored to the permissible range. This control may be performed manually or automatically.

Furthermore, the nozzle position or the distance from the tip of the nozzle 1300 to the plasma 1303 is observed by a CCD camera installed outside the vacuum vessel (not shown). Thus, control action is performed by driving the X-, Y- and Z-axis stages 1307, 1308, 1309 with the central processing unit so that the nozzle position and the distance between the tip of the nozzle 1300 and the plasma 1303 are kept at constant values at all times.

While the LPX is in operation, the nozzle 1300 undergoes axial rotation at a constant speed about the feed-out direction of the target material 1302 by the rotating stage 1306. During the rotation of the nozzle 1300, the position and inclination of the nozzle 1300 and the distance from the tip end of the nozzle 1300 to the plasma 1303 are constantly monitored by the displacement sensors 1304, 1305 or a CCD camera placed outside the vacuum vessel. These values are controlled by the X-, Y- and Z-axis stages 1307, 1308, 1309, and the gonio-stage 1310 so that the values are kept within permissible ranges.

In FIG. 6, the plasma is produced in a location that is offset toward the lens from the area directly above the nozzle 1300. Accordingly, the tip of the nozzle 1300 is abraded away to a greater extent on the lens side. However, since the nozzle 1300 undergoes axial rotation, the nozzle 1300 is abraded symmetrically with respect to the axis constituted by the feed-out direction of the gas. As a result, the symmetry of the nozzle tip shape is preserved so that the feed-out of the gas can be continued in a fixed direction (such as directly upward as in the exemplary configuration of FIG. 6) without any need to alter the feed-out direction of the gas. Consequently, the gas density at the laser focal position is constant so that the generation of X-rays can be continued in a stable manner.

In FIG. 6, the measurement and correction of the inclination of the nozzle 1300 are performed in only one axial direction (i.e., the direction of the optical axis of the laser). However, it would also be possible to attach a similar displacement sensor and gonio-stage in the direction perpendicular to the optical axis of the laser, and to perform a control action in two axial directions. By thus measuring and correcting the inclination of the nozzle 1300 along two axes, the direction in which the gas is blown out is maintained constant even while the nozzle 1300 is undergoing axial rotation.

As shown, in FIG. 6, a gaseous target material 1302 jets from the nozzle 1300. However, other materials may be used. A liquid or liquid droplets may be used to jet from the nozzle 1300, or fine particles of a solid material could be jet from the nozzle 1300 together with a gas. Alternatively, such particles could also be allowed to fall freely. Furthermore, the target material 1302 may be in a heated or cooled gas, liquid, solid or finely particulate solid state.

Furthermore in FIG. 6, a nozzle 1300 has been described as the target material feed-out portion. However, as long as the target material feed-out portion is a mechanism to feed out the target material 1302, there is no requirement that this portion be a nozzle 1300. For example, if a fine wire is fed out from the interior of a cylindrical member as disclosed, for example, by Japanese Patent Application No. 10-265887 (which is incorporated by reference), the cylindrical member can undergo axial rotation so that the position of the tip end remains constant.

Figure 4:
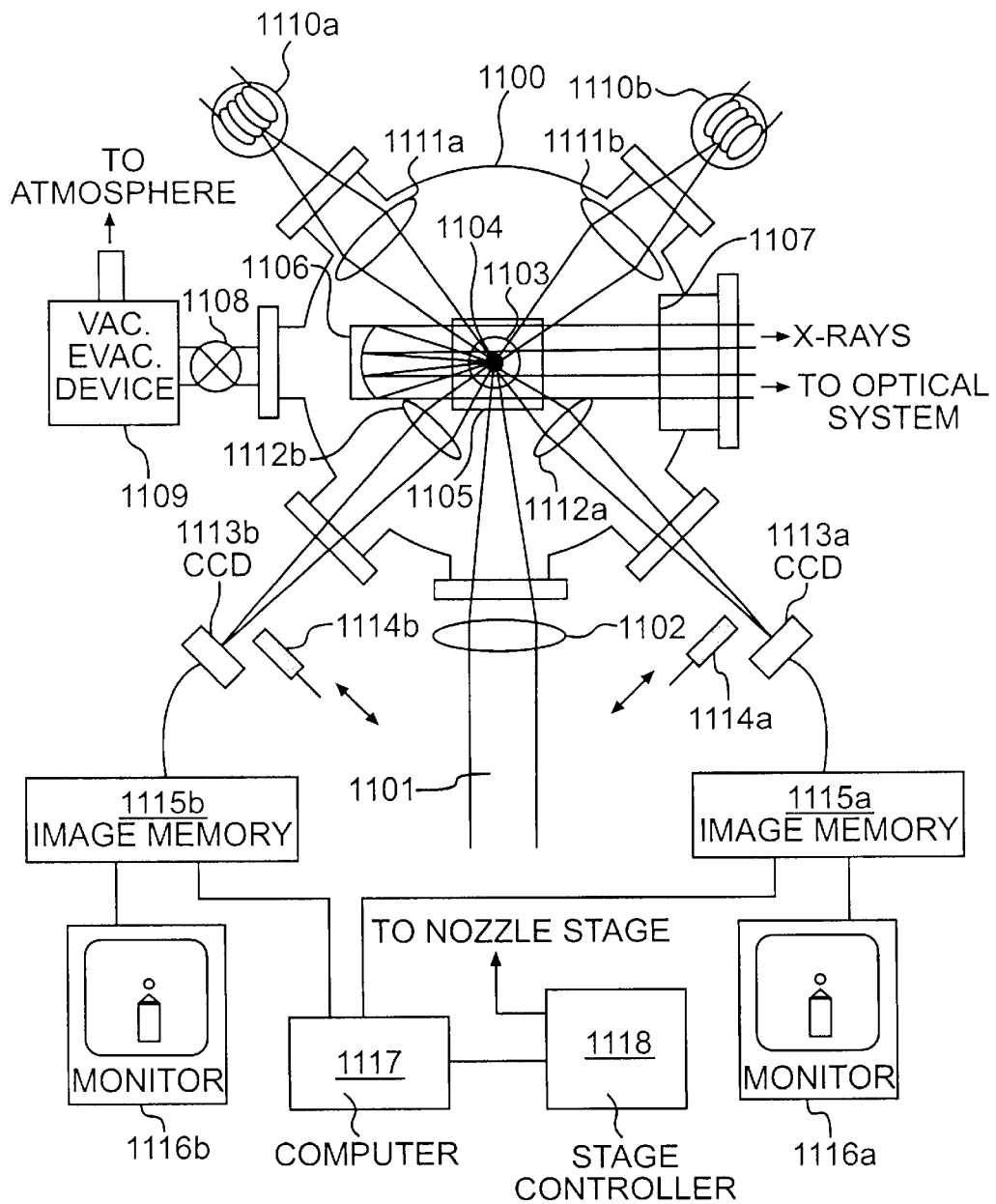
FIG. 4 is a schematic diagram of an LPX X-ray generating device according to a configuration of the present invention.

An exemplary application of the foregoing feed-out portion will now be described in detail. Of course, the invention is not limited to this configuration. FIG. 4 shows a top view of an X-ray generating device.

The interior of the vessel 1100 is evacuated by a vacuum evacuation device 1109 to a reduced pressure so that the laser light will not discharge in the air and so that the X-rays radiated from the plasma will not be significantly attenuated due to absorption. A target material, such as krypton, is caused to jet into the interior of the vacuum vessel using a stainless steel gas jet nozzle 1103 as the target material feed-out portion. The direction of this gas jet is perpendicular to the plane of the page so that the gas is caused to jet from the back surface of the page toward the front surface of the page.

Pulsed laser light 1101 emitted from a laser device (not shown) is focused at a position 0.5 mm directly above the nozzle 1103 by a lens 1102, thereby generating a plasma 1104. The shape of the plasma 1104 is a filament-form shape such that the size of the plasma is approximately 300 $\mu$m in the direction of the optical axis of the laser, and approximately 100 $\mu$m in the direction perpendicular to the optical axis of the laser. Furthermore, the plasma 1104 is generated in a position that is offset toward the side of the focusing lens 1102 by approximately 100 $\mu$m from the area directly above the nozzle.

Among the X-rays emitted from the plasma 1104, only X-rays of a specified wavelength (e.g., 13 mn) are reflected by a parabolic mirror 1106 coated with a multi-layer film, thereby forming parallel X-ray light. Afterward, the X-rays pass through a visible-light-cutting X-ray-transmitting filter 1107 (e.g., a thin film of Be or a thin film of Si) to be conducted into the X-ray optical system of the next stage.

A stage group 1105 having a rotating stage to axially rotate the nozzle 1103 about the gas jet axis in a manner as described with reference to FIG. 6, tri-axial linear stages to determine and control the position of the nozzle, and two gonio-stages to control the inclination of the nozzle are attached to the lower portion of the nozzle 1103.

In the example of FIG. 4, CCD cameras detect the position and inclination of the nozzle 1103 as well as the distance between the tip end of the nozzle 1103 and the plasma 1104. Thus, positions are confirmed by images of the nozzle 1103 and plasma 1104 as will now be described.

Light from the light source 1110a is directed onto the nozzle 1103 by an illuminating lens 1111a from a direction that is oriented at an angle of 45° with respect to the optical axis of the laser. The transmitted light is magnified by an objective lens 1112a and focused as an image on a two-dimensional detector (CCD1) 1113a. Furthermore, a light source is also positioned in a direction that is perpendicular to the above-mentioned direction. Light from the light source is similarly directed onto the nozzle 1103 by illuminating lens 1111b. The transmitted light is then magnified by an objective lens 1112b and focused as an image on a two-dimensional detector (CCD2) 1113b.

Light-reducing filters 1114a, 1114b are freely insertable or removable to be attached in front of the respective CCD's 1113a, 1113b. Furthermore, the output signals of the CCD's 1113a, 1113b are input into respective image memories (frame memories) 1115a, 1115b. The input images are displayed on monitor television sets 1116a, 1116b. The image data input into the image memories 1115a, 1115b is sent to a personal computer 1117 to be stored in an external memory element (such as hard disk or the like). A stage controller 1118 is connected to the personal computer 1117 so that all of the stages of the stage group 1105 to which the nozzle 1103 is attached are driven by the stage controller 1118. Once the position of the nozzle 1103 has been determined by driving the stage group 1105 so that the intensity of the X-rays from the plasma 1104 is at a maximum and so that the angular distribution of the X-rays is a specified distribution, the images of the nozzle 1103 taken by CCD1 (1113a) and CCD2 (1113b) are input into the image memories and stored on a hard disk. The images are hereafter referred to as the "initial nozzle images."

Next, the position of plasma generation is determined by actually generating a plasma 1104. Besides X-rays, visible light is also radiated from the plasma 1104. The visible light emission region is broader than the X-ray emission region. However, X-rays may be viewed as being radiated from the brightest portion of the visible-light image or from the central portion of the visible-light image. Accordingly, visible-light images of the plasma 1104 are acquired by CCD1 (1113a) and CCD2 (1113b). In this case, the visible light from the plasma 1104 is extremely intense. Accordingly, light-reducing filters 1114a and 1114b are inserted to obtain an appropriate brightness, thereby preventing saturation of the CCD'S.

The brightest positions in the visible-light images of the plasma 1104 that are obtained (or the center-of-gravity positions of the brightness) and are used as the plasma position. The distance from the tip of the nozzle 1103 to the plasma 1104 can be determined from this plasma position and also from the previously taken nozzle images. The distance from the tip of the nozzle 1103 to the plasma 1104 thus obtained is stored in the personal computer as the initial value (this value is hereafter referred to as the "initial nozzle-plasma distance").

Once continuous operation of the LPX has been initiated, the rotating stage (among the stages of the stage group 1105) begins rotating continuously at a constant angular velocity. Furthermore, nozzle and plasma images are taken at each laser shot, at fixed intervals, or following each completion of a specified number of laser shots. The position and inclination of the nozzle 1103 as well as the distance from the tip of the nozzle 1103 to the plasma 1104 are measured. As a result, changes in the position or inclination of the nozzle 1103 or in the distance from the tip end of the nozzle 1103 to the plasma 1104 can be determined by comparing the measured values with the initial nozzle images or the initial nozzle-plasma distance. If the measured values exceed permissible limits, the corresponding stages of stage group 1105 to which the nozzle 1103 is attached are driven to keep the values within permissible limits.

As a result of this procedure, the position and inclination of the nozzle 1103, and the distance from the tip end of the nozzle 1103 to the plasma 1104 can be maintained at constant values even while the nozzle is rotating. Furthermore, even if the LPX is operated for a long period of time so that the tip of the nozzle 1103 is abraded away, the rotation of the nozzle 1103 causes the tip of the nozzle 1103 to be uniformly abraded, thereby insuring that the shape will be symmetrical with respect to the axis of the gas jet.

Accordingly, because the gap between the tip of the nozzle 1103 and the plasma 1104 where laser focal position is defined is maintained substantially at a constant value, the density of the gas at the focal position of the laser light is also maintained at a substantially constant value. As a result, an intensity that does not vary from the initial X-ray intensity or angular distribution of X-rays can be maintained.

In the example of FIG. 4, the position and angle of the nozzle 1103 were determined by constant imaging using the CCD's. However, changes in the position and angle of the nozzle 1103 accompanying rotation of the nozzle 1103 show no variation once the nozzle 1103 has been set. Accordingly, if the rotational angles of the rotating stage and the corresponding nozzle positions and angles are stored in memory while the rotating stage (to which the nozzle 1103 is attached) rotates prior to the operation of the LPX, the respective stage correction amounts for each rotational angle can be stored in memory as data. Then, during actual operation of the LPX, the respective stages can be controlled on the basis of the rotational angle of the rotating stage and the data indicating amounts of correction, without measuring the position or inclination of the nozzle 1103. If this is done, the need for data processing for the measurement of the position and inclination of the nozzle 1103 is eliminated except for the measurement of the distance between the tip of the nozzle and the plasma. Accordingly, the load on the central processing unit can be reduced.

If the optical axis of the laser is fixed, the measurement of the distance between the tip end of the nozzle 1103 and the plasma 1104 can also be simplified. Furthermore, if the optical axis of the laser is fixed, the focal position of the laser light (in the direction of height) is fixed so that the height at which the plasma 1104 is generated does not vary. In such a case, it is sufficient to take only nozzle images in order to determine the gap between the tip of the nozzle 1103 and the plasma 1104, without determining the plasma position by taking plasma images each time. Specifically, nozzle images are taken at fixed intervals or following each completion of a specified number of laser shots, and the extent to which the tip of the nozzle 1103 has been abraded is investigated by comparing these images with the initial nozzle images taken prior to the initiation of operation of the LPX. If the abraded portion of the nozzle 1103 exceeds permissible limits, the stages of the stage group 1105 to which the nozzle 1103 is attached are moved in the direction of the gas jet so that the resulting position is substantially at the same position as in the initial nozzle images. As a result, the requirements to determine the plasma position each time can be eliminated, thereby making the process more efficient. If the position and inclination of the nozzle 1103 and the distance between the tip of the nozzle 1103 and the plasma 1104 position are thus measured and maintained at constant values by observing images of the nozzle 1104, there is no need to interrupt the operation of the LPX (laser light irradiation or gas jet). Accordingly, the process is more efficient.

If the nozzle has been abraded so that the shape of the nozzle 1103 differs greatly from the initial shape, it is necessary to replace the nozzle 1103. Here, nozzle images are observed from two directions. Accordingly, the position of the nozzle can be precisely determined. Accordingly, after a new nozzle 1103 has been attached, it is sufficient to use a procedure in which nozzle images are taken from two directions, these images are compared with the initial nozzle images taken from two directions prior to nozzle replacement, and the stages to which the nozzle 1103 is attached are moved so that the respective images agree. If this is done, positional adjustment at the time of nozzle replacement is facilitated and can be performed quickly so that the operating efficiency of the LPX can be increased. In the present working example, nozzle images are observed from two directions. However, the directions of observation are optional, and the number of different directions of observation is also optional (observations may be made from one direction, or from three or more directions).

Furthermore, rotation of the nozzle 1103 has been described as continuous. However, the rotation may alternatively be performed in a stepwise through a fixed angle at fixed intervals or upon each completion of a specified number of times of laser irradiation. Moreover, rotation may be continued in the same direction, or the system may be arranged so that the nozzle 1103 is rotated in the reverse direction after rotating through a fixed angle. For example, it would also be possible to arrange the system so that the nozzle 1103 is rotated 180° in the counterclockwise direction after being rotated 180° in the clockwise rotational direction.

Furthermore, the plasma position (or position of X-ray generation) is estimated from visible-light images of the plasma. However, it would also be possible to determine the plasma position (position of X-ray generation) by the direct observation of X-rays using an X-ray pinhole camera or other suitable system.

Krypton (Kr) has been described as the target material. However, another substance that is a gas at room temperatures (such as xenon (Xe), carbon dioxide ($CO_2$), nitrogen ($N_2$), or the like) may be used. Moreover, the target material is not limited to gaseous substances, but liquids or solids may be used. Also, liquid droplets may be used. With a solid target material, fine particulate solids (e.g., tin (Sn) or compounds of tin such as fine particles of tin oxide ($SnO_2$) or the like may be used. Moreover, gases, liquids or solids in a heated or cooled state may be used.

The target, as described, jets from a nozzle. However, if the target material is a liquid or fine particles of a solid, the target material may drop freely. Moreover, the jet of the target material from the nozzle may be a pulsed jet or a continuous jet.

Moreover, stainless steel has been described as the nozzle material. However, other materials may be selected. If a material that is difficult to sputter (for example, molybdenum (Mo), tantalum (Ta) or tungsten (W)) is used as the nozzle material, the quantity of debris from the nozzle will decrease. Accordingly, the quantity of such material adhering to the optical elements can be reduced. If a high transmissivity material with respect to X-rays is used as the nozzle material of the nozzle, the effects of debris from the nozzle depositing to the optical elements (i.e., a drop in transmissivity or reflectivity) can be reduced even if such debris do deposit to the optical elements. For example, if the wavelength of the X-rays is near 13 nm, then SiC, $SiO_2ZrO_2$, Mo, or the like may be used as the nozzle material because Si, Zr and Mo have relatively high transmissivities with respect to X-rays.

In the foregoing description, the position of the tip of the nozzle 1103 has been determined and controlled by observing nozzle images. However, other techniques may be used, including measuring the position of the tip of the nozzle 1103 using contact needle type sensors or non-contact sensors (for example, laser displacement sensors). Here, the advantage of a simple measuring system is obtained because the nozzle position is determined directly by the measuring instrument. Also, the nozzle may be illuminated by Koehler illumination.

The X-ray generating device as described thus far may be installed in an X-ray exposure apparatus. In such a case, the X-ray exposure apparatus uses the X-ray generating device as a light source such that an illumination optical system illuminates a mask on which a pattern is drawn and a projection optical system receives the light transmitted or reflected by the mask and exposes the surface of a substrate which is coated with a photosensitive resin.

The quantities of laser light, X-rays, may vary due to contamination of the X-ray extraction window, the laser light entry window, and the illuminating light entry window in the vacuum vessel by the debris that accompanies plasma generation. To prevent these variations, replaceable transparent screening members can be installed between the respective windows and the target material. As a result, there is no adhesion of debris to the respective windows, and stable light is transmitted by periodically replacing the screening members. Furthermore, a mechanism (for example, a mechanism around which belt-form screening members are wrapped) can move the screening members so that fresh screening members are moved into position when the screening members become contaminated.

Thus, the X-ray generating device of the present invention has a rotating mechanism to rotate the target material feed-out portion. Accordingly, even if the target material feed-out portion is abraded by the plasma, the target material feed-out portion is abraded uniformly or symmetrically with respect to the feed-out direction of the target material. Consequently, operation of the LPX can be continued for a long period of time without altering the feed-out direction of the target material.

Furthermore, by detecting the position of the target material feed-out portion and moving the target material feed-out portion, the position and angle of the target material feed-out portion or the position of the tip end of the target material feed-out portion can be maintained at the initial positions at all times. As a result, even if the LPX is operated for a long period of time, the density of the target material at the focal position of the laser light and the position of the target material can be maintained constant. Accordingly, the generation of X-rays can be stably provided over a longer period of time. Furthermore, even when the target material feed-out portion is replaced, the new target material feed-out portion can be readily positioned in the specified position, thereby shortening the replacement time and improving the operating efficiency of the device.

Target Feed-Out Portion Control Device

Yet another aspect of the present invention provides a target material feed-out portion control device. Exemplary configurations will be now described with reference to FIGS. 7–10. FIG. 10 is a schematic diagram showing the vicinity of the target material feed-out portion in a X-ray generating device.

Here, a nozzle 2400 is used as the target material feed-out portion, and a gaseous target material 2402 is sprayed into a vacuum vessel (not shown) from the nozzle 2400. The direction of the gas jet is from the bottom of the page toward the top. The sprayed gas is rapidly cooled as a result of adiabatic expansion. Furthermore, the molecules (or atoms) of the gas adhere to each other as a result of van der Waals forces, thereby forming clusters.

Pulsed laser light 2401 is focused directly above the nozzle 2400 near the tip of the nozzle 2400. Thus, a plasma 2403 is generated substantially at this position so that X-rays are radiated therefrom. Further, a contact needle type displacement sensor 2405 is disposed in the vicinity of the nozzle 2400. This contact needle type sensor 2405 can be rotated using rotating leading-in terminal 2404 and is ordinarily positioned in a position other than directly above the nozzle 2400. Periodically, the laser irradiation and gas jet are stopped, and the rotating leading-in terminal 2404 is rotated so that the contact needle type sensor 2405 is moved to a point directly above the nozzle 2400. Then, the position (height) of the tip end of the nozzle 2400 is measured as an exemplary tool for detecting the position of the tip end of the target material feed-out portion. If the measured position (height) exceeds permissible limits, a stage 2406 attached to the lower portion of the nozzle 2400 is driven to position the tip end of the nozzle 2400 as an exemplary method for positioning the target material feed-out portion.

If displacement sensors are installed not only in the axial direction in which the target material is blown out but also for two axes in the plane perpendicular to this axis, the specific position of the nozzle 2400 can be determined. Accordingly, the position of the nozzle 2400 can be quickly and easily determined when the nozzle 2400 is replaced.

While a contact needle type sensor 2405 has been described for detecting the position of the tip of the nozzle 2400, other types of sensors may be utilized, such as an electrostatic capacitance type or optical type position sensor. When an electrostatic capacitance type sensor is used, the sensor is positioned near a metal nozzle so that the distance between the metal nozzle and the sensor is determined from the electrostatic capacitance between the nozzle and the sensor. Since there is no contact with the nozzle in this system, the system can be installed regardless of the shape of the nozzle. Furthermore, since there is no need to move the position of the sensor when the nozzle is replaced, replacement is facilitated. Moreover, since the sensor does not need to be moved, there is no measurement error due to a shift in the measurement position before and after nozzle replacement. Accordingly, measurements are highly reproducible.

When an optical position sensor is used, light from a semiconductor laser focused by a lens strikes the nozzle. The reflected light or scattered light is collected and focused on a CCD linear sensor. The distance that the nozzle has moved is measured using the variation in this focal position. Since this system also involves no contact with the nozzle, the advantages mentioned above with respect to the electrostatic capacitance type sensor are obtained. Furthermore, an optical sensor can be used even if the object being measured is not made of metal.

Variations in the position of the top of the nozzle 2400 can be monitored by observing an image of the nozzle 2400 even if the position of the tip of the nozzle 2400 is not directly measured by a position sensor. Here, observations can be made even while gas is being sprayed from the nozzle 2400 and the position of plasma generation can be observed. Accordingly, variations in the gap between the tip of the nozzle 2400 and the position of plasma generation can be directly observed.

Furthermore, in FIG. 10, the target material 2402 is sprayed from a nozzle 2400. However, any desired mechanism for feeding out the target material may be used. For example, if a fine wire is fed out (extruded) from the interior of a cylindrical member (as disclosed, for example, by Japanese Patent Application No. 10-265887), the system may be configured with the tip end of the cylindrical member fixed. The target material 2402 has been described as a gaseous material, but a solid, solid fine particles, a liquid material, or a mixture of solid and liquid materials can used.

Figure 7:
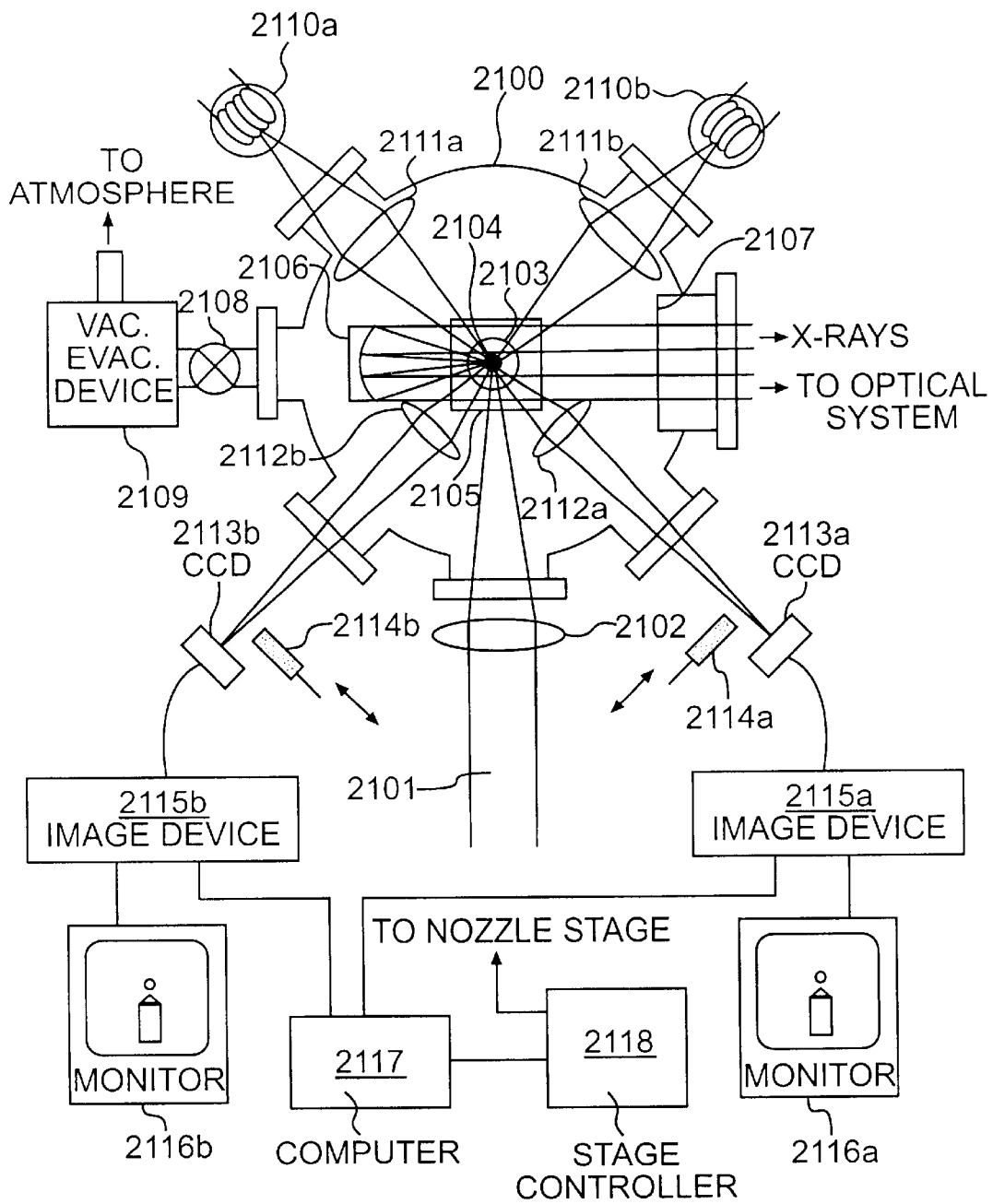
FIG. 7 is a schematic diagram of an X-ray generating device according to another configuration of the present invention.

Specifically, an exemplary method for confirming the positions of the tip of a nozzle and a plasma using a CCD will be now described with reference to FIG. 7. FIG. 7 is a top view of an exemplary X-ray generating device.

The interior of the vessel 2100 is evacuated by a vacuum evacuation device 2109 to a reduced pressure at which the laser light will not discharge in the air and at which the X-rays radiated from the plasma will not be significantly attenuated by absorption. The target material (for example, krypton) is jetted into the interior of the vacuum vessel using a stainless steel gas jet nozzle 2103 which serves as the target material feed-out portion. The direction of this gas jet is perpendicular to the plane of the page in FIG. 7 so the gas jets from the back surface of the page toward the front surface of the page. Pulsed laser light 2101 is emitted from a laser device (not shown) to be focused at a position located 0.5 mm above the nozzle 2103 by a lens 102 so that a plasma 2104 is generated substantially this position.

Light from a light source 2110a located at an angle of 45° from the laser optical axis is directed onto the nozzle 2103 by an illuminating lens 2111a. The transmitted light is magnified by an objective lens 2112a disposed facing the light source 2110a and is focused as an image on a two-dimensional detector (CCD1) 2113a. Furthermore, a light source for illuminating the nozzle 2103 is installed in a direction perpendicular to this direction. The nozzle 2103 is similarly illuminated by a lens 2111b. The transmitted light is then magnified by an objective lens 2112b and focused as an image on the surface of a two-dimensional detector (CCD2) 2113b. Detachable light-reducing filters 2114a, 2114b are attached in front of the respective CCD's. Furthermore, the output signals of the CCD's are input into respective image memories (frame memories) 2115a, 2115b. The input images are displayed on respective monitor television sets 2116a, 2116b. Moreover, the image data input into the image memories 2115a, 2115b is sent to a personal computer 2117 to be stored in an external memory element (such as a hard disk).

Furthermore, a stage controller 2118 is connected to the personal computer 2117 and the system is arranged so that a stage 2105 to which the nozzle 2103 is attached can be driven by the stage controller 2118 along three axes. That is, the stage 2105 can move in the direction of the gas jet (the direction perpendicular to the plane of the page in FIG. 7), in the direction of the laser optical axis (the vertical direction in the plane of the page in FIG. 7), and in the direction perpendicular to both of these directions (the horizontal direction in the plane of the page in FIG. 7).

Among the X-rays emitted from the plasma 2104, only X-rays of a specified wavelength (for example, 13 nm) are reflected by a parabolic mirror 2106 coated with a multi-layer film so that these X-rays are converted into parallel light. Afterward, the X-rays pass through a visible-light-cutting X-ray-transmitting filter 2107 (e.g., a thin film of Be, a thin film of Si, or the like) and are thus provided to the X-ray optical system of the next stage.

Next, the method used to confirm the nozzle position in the exemplary configuration of FIG. 7 will be described.

First, the stage 2105 is driven so that the intensity of the X-rays from the plasma 2104 reaches a maximum and the angular distribution of the X-rays has a prescribed distribution. This corresponds to the optimal nozzle position. Once the optimal nozzle position has been determined, images of the nozzle 2103 acquired by CCD1 (2113a) and CCD2 (2113b) are input into the image memories 2115a, 2115b and stored in the external memory element as the initial nozzle images.

Next, the position of plasma generation is determined by actually generating a plasma 2104. Besides X-rays, visible light is also radiated from the plasma 2104 in a broader spatial region than the X-rays. However, X-rays may be interpreted as being radiated from the brightest portion of the visible-light image or from the central portion of the visible-light image. Accordingly, visible-light images of the plasma 2104 are acquired by CCD1 (2113a ) and CCD2 (2113b). In this case, the visible light from the plasma 2104 is extremely intense. Accordingly, light-reducing filters 2114a and 2114b are inserted so that an appropriate intensity is obtained, thereby preventing saturation of the CCD's. The brightest positions in the visible-light images of the plasma or the center-of-gravity positions of the brightness are determined and taken as the plasma position. The distance from the tip of the nozzle 2103 to the plasma 2104 is then known from the thus determined plasma position and the previously taken nozzle images. The distance from the tip of the nozzle 2103 to the plasma 2104 is stored in the personal computer as the initial value.

In the described example, the plasma position (position of X-ray generation) has been estimated from visible-light images of the plasma. However, the plasma position (position of X-ray generation) may also be determined by the direct observation of X-rays using X-ray pinhole cameras or other suitable system.

After the operation of the LPX begins, nozzle images and plasma images are taken at fixed intervals or for each specified number of laser shots, and the distance from the tip of the nozzle 2103 to the plasma 2104 is measured. If the measured distance from the tip of the nozzle 2103 to the plasma 2104 exceeds the upper limit of a permissible range, the stage 2105 is moved in the direction of the gas jet (i.e., in the direction perpendicular to the plane of the page in FIG. 7) so that the distance is restored to the initial distance.

By controlling the nozzle position as described, the gap between the tip of the nozzle 2103 and the plasma 2104 is maintained at a substantially constant value even if the LPX is operated for a long period of time so that the tip of the nozzle 2103 is abraded. Accordingly, the gas (cluster) density at the laser light focal position remains substantially constant so that the X-ray intensity remains the same as the initial X-ray intensity. If the optical axis of the laser is fixed, then the focal position of the laser light 2101 remains fixed. Accordingly, the height at which the plasma 2104 is generated does not vary. Thus, even if the plasma position is not determined periodically using plasma images, it is sufficient to use only images of the nozzle. That is, images of the nozzle 2103 are taken at fixed intervals or after each specified number of laser shots, and the extent of the abrasion on the nozzle 2103 is determined by comparing these images with the nozzle tip position in the initial nozzle images obtained prior to the initiation of LPX operation. As a result, if the abraded portions exceed permissible limits, the stage 2105 is moved in the gas jet direction to reposition the nozzle in substantially the same position as in the initial nozzle images. As a result, operation is facilitated because the effort to determine the plasma position is less frequent or eliminated.

If the distance between the nozzle tip and the plasma position is thus maintained constant by observing nozzle images, there is no interruption of LPX operation, thereby improving operating efficiency. Furthermore, if the nozzle 2103 has been abraded so that the shape of the nozzle 2103 differs greatly from the initial shape, it is necessary to replace the nozzle. However, the need for nozzle replacement can be accurately determined, thereby avoiding unnecessary replacements.

Also, nozzle images are observed from two directions. Therefore, the nozzle 2103 position can be precisely determined. Here, the method may be implemented as follows. First, after the new nozzle 2103 has been attached, nozzle images are taken from two directions and compared with the initial nozzle images taken from two directions prior to the replacement of the nozzle 2103. Then, the stage 2105 to which the nozzle 2103 is attached is moved so that both sets of images coincide. If this is done, then positional adjustments during nozzle replacement can be performed easily and quickly, thereby increasing-operating efficiency of the LPX. Here, the nozzle 2103 is observed from two perpendicular directions. However, the directions of observation and the number of different directions from which observations are optional (observations may alternatively be made from one direction, or from three or more directions).

Furthermore, the illumination of the nozzle 2103 may also be Koehler illumination. In the configuration of FIG. 7, a transmission microscope construction has been described, but the system may use general imaging of illumination light reflected from the nozzle as imaged by the CCD cameras.

Figure 8:
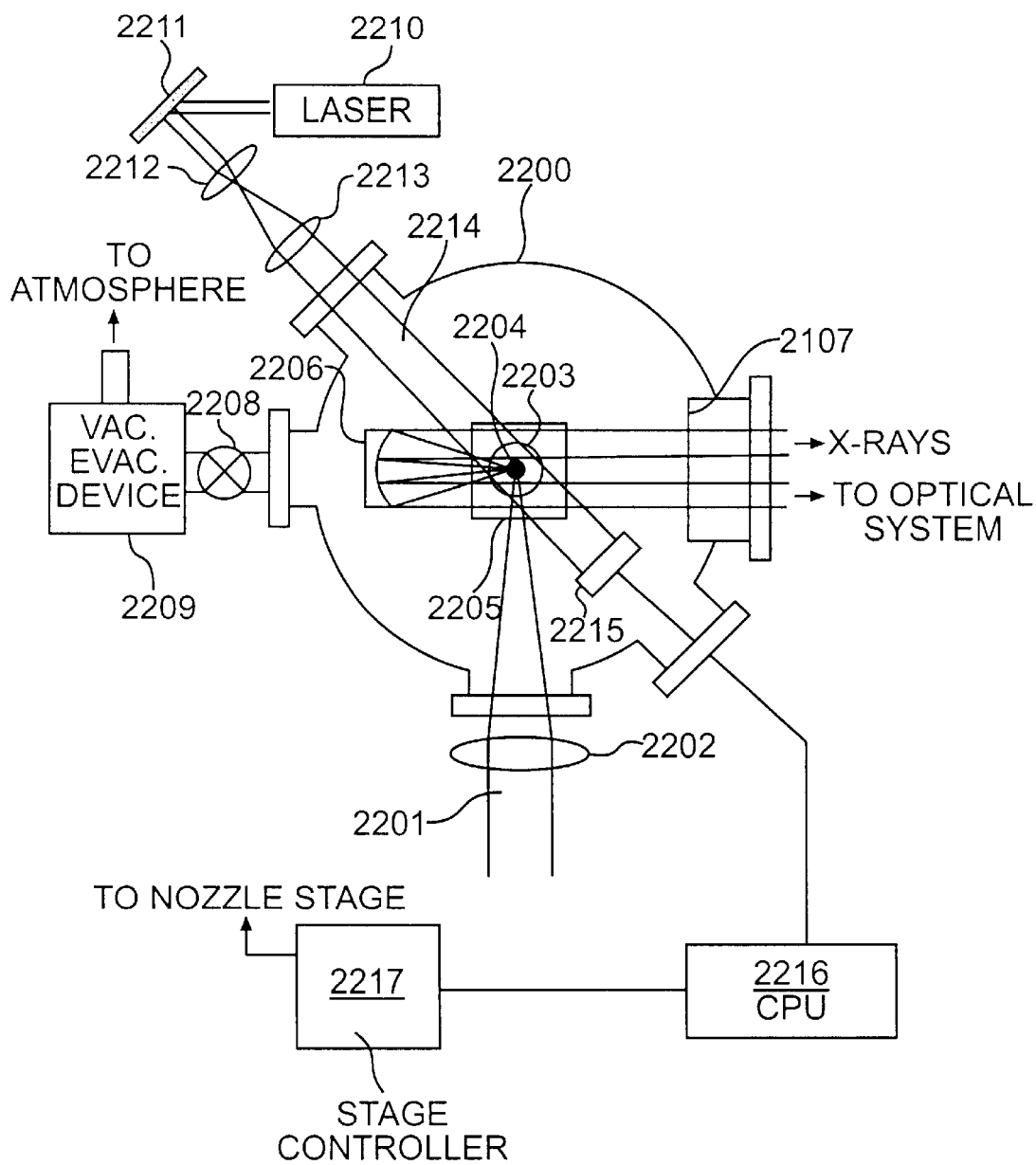
FIG. 8 is a schematic diagram of an X-ray generating device according to another configuration of the present invention.

FIG. 8 shows another configuration wherein the optical axis of the laser light is fixed, so that the position (height) of plasma generation does not vary. Here, abrasion of the nozzle tip can be ascertained more simply.

The configuration of the system of FIG. 8 is generally similar to the configuration shown in FIG. 7. The stainless steel nozzle 2203 is attached to a stage 2205, which is movable along three axes (i.e., the gas jet direction perpendicular to the plane of the page, the direction of the laser optical axis, and the direction perpendicular to both of these directions). The stage 2205 is driven by a stage controller 2217 which is disposed outside of the vacuum vessel. In an exemplary system, krypton (Kr) is used as the target material. Laser light 2201 is focused on the gas-form or cluster-form target material that jets from the nozzle 2203 to generate the plasma 2204. Among the X-rays emitted from the plasma 2204, only X-rays of a specified wavelength (for example, 13 nm) are reflected by a parabolic mirror 2206 coated with a multi-layer film, thereby forming parallel X-ray light. Then, the X-rays pass through a visible-light-cutting X-ray-transmitting filter 2207 (e.g., a thin film of Be, a thin film of Si, or the like) and are transmitted into the X-ray optical system of the next stage.

The laser light emitted by the He—Ne laser 2210 is reflected by a mirror 2211. Then, the beam diameter is broadened by lenses 2212, 2213 to be converted into parallel X-ray light, thereby forming a beam 2214. A portion of the beam 2214 is applied to the nozzle 2203 so that the transmitted light is detected by a photodiode 2215 that is sensitive to visible light.

Figure 9:
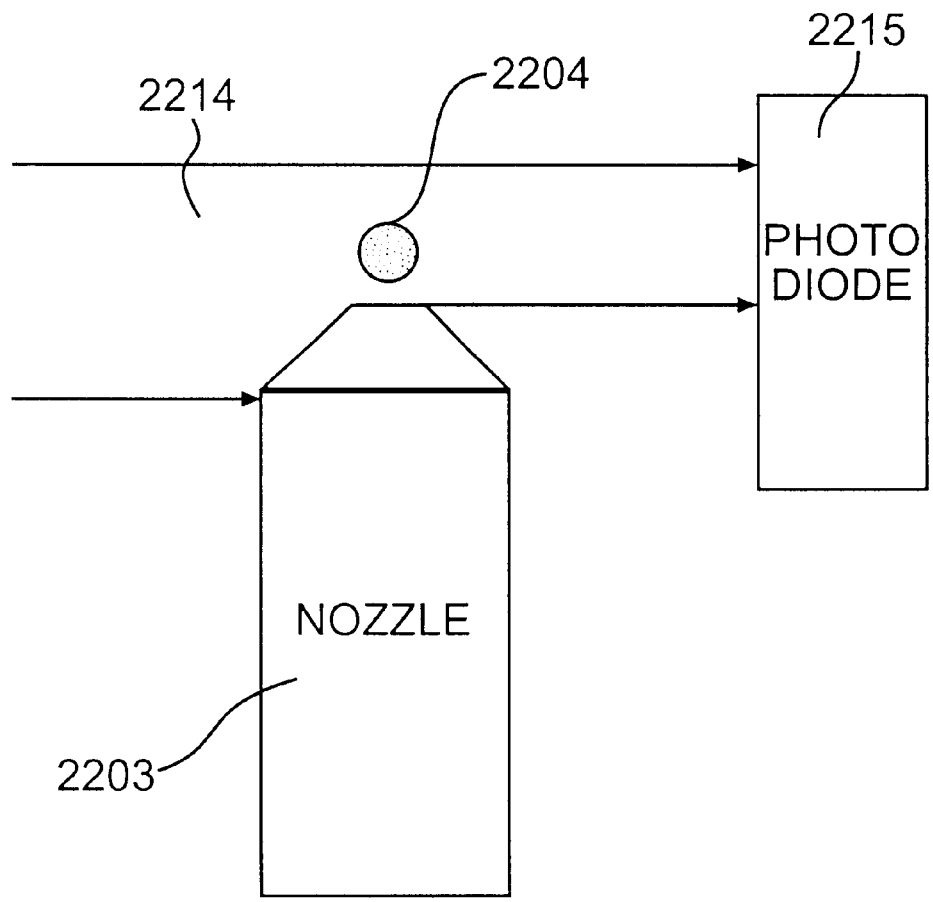
FIG. 9 is a side view of the nozzle and photodiode of the second working example of the present invention as seen from the side.
Figure 10:
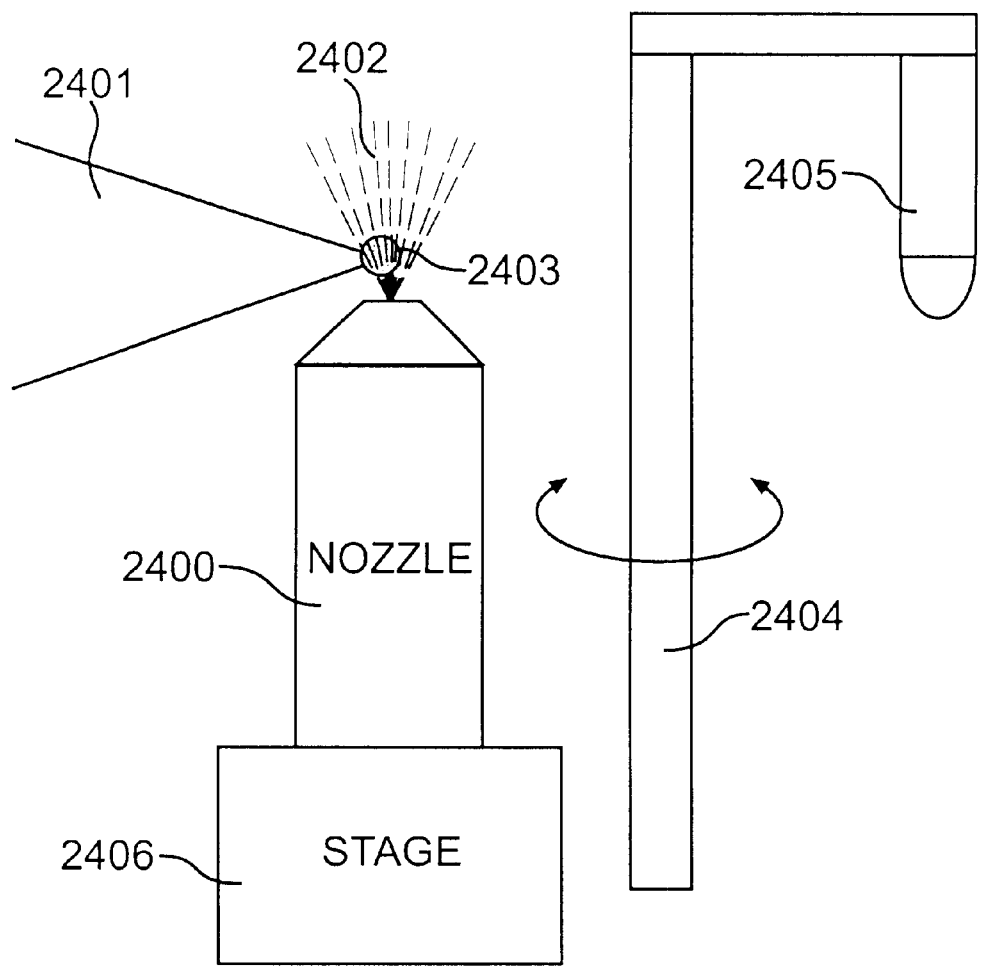
FIG. 10 is a schematic diagram of the construction involved in another working configuration of the present invention.

FIG. 9 shows an enlarged side view of the nozzle 2203 and photodiode 2215. As shown, a portion of the laser beam 2214 strikes the tip end portion of the nozzle 2300, and the transmitted light is incident on the photodiode 2215. Here, the plasma 2204 is shown above the nozzle 2203.

In FIG. 8, the output signal of the photodiode 2215 is input into a central processing unit 2216 (for example, a personal computer). When the plasma 2204 is generated, the photodiode 2215 also detects visible light emitted from the plasma 2204 in addition to the He—Ne laser light 2214. Accordingly, the timing at which sampling is performed is controlled so that the output of the photodiode during the emission of light from the plasma is not input into the central processing unit 2216. Once the position of the nozzle 2203 has been determined by driving the stage 2205 so that the intensity of the X-rays from the plasma 2204 reaches a maximum or so that the angular distribution of the X-rays has a desired distribution, the output signal of the photodiode 2215 in response to the He—Ne laser beam 2214 is stored in the central processing unit 2216. After the operation of the LPX is initiated, the output signal of the photodiode is input at fixed intervals or upon each completion of a fixed number of times of laser light irradiation, and the intensity of the transmitted light from the He—Ne laser beam 2214 is measured. When the nozzle 2203 is abraded by the plasma 2204, the amount of He—Ne laser light reaching the photodiode increases, thereby increasing in the photodiode output.

When the output signal of the photodiode exceeds a specified strength, the gap between the tip end of the nozzle and the plasma is considered widened. Accordingly, a signal is sent to the stage controller 2217, and the stage 2205 is driven so that the nozzle 2203 is moved in the direction of the gas jet, thereby restoring the output of the photodiode to substantially the original value.

As a result, the position of the nozzle tip can be maintained in substantially the initial state. In this case, if the relationship between the height of the nozzle 2203 (i.e., the position of the nozzle with respect to the direction in which the gas is blown out) and the amount of transmitted light of the He—Ne laser beam 2214 detected by the photodiode 2215 is investigated beforehand, the position (height) of the nozzle 2203 can be ascertained from the strength of the output signal of the photodiode 2215 when the strength of the output signal of the photodiode 2215 varies after long-term operation of the LPX. Therefore, the distance that the nozzle 2203 must be moved in the direction in which the gas is blown out can be determined. Thus, the distance between the nozzle tip and the plasma portion can be accurately and quickly restored.

Here, a photodiode has been described to measure the transmitted He—Ne laser beam, but other suitable devices may be used as long as the device is sensitive to the beam used. Furthermore, a two-dimensional detector, such as a CCD or the like, may also be used. Also, the light source may be an ordinary lamp rather than a He—Ne laser. A material that is a gas at ordinary temperatures, such as krypton, has been described as the target material. However, the present invention contemplates that any desired type of gas, such as xenon (Xe) or carbon dioxide ($CO_2$), may be used, including single types of gases or a mixed gases. Moreover, the target material also may be a liquid or a solid. In the case of liquid target materials, liquid droplets may be used. In the case of a solid target materials, fine particles may be used (such as fine particles of tin (Sn) or a tin compound (such as tin oxide ($SnO_2$)). Furthermore, the target material may be a gas, liquid or solid in a heated or cooled state.

A gaseous target material is jetted from a nozzle 2203, but a liquid or fine particles of a solid may be freely dropped. Moreover, the target material from the nozzle 2203 may be a pulsed jet or a continuous jet.

In the examples of FIGS. 7 and 8 described above, stainless steel was used as the material of the nozzle. However, a material that is difficult to sputter (e.g., molybdenum (Mo), tantalum (Ta), tungsten (W)) may be used so that the nozzle will be more abrasion resistant, thereby minimizing the quantity of stray particles from the nozzle. Accordingly, the quantity of such material adhering to the optical elements will be reduced.

Furthermore, if the nozzle material has a high transmissivity with respect to X-rays, the effects of stray particles adhering to the optical elements (i.e., a drop in transmissivity or reflectivity) can be reduced even if such particles do adhere to the optical elements. For example, with X-rays having a wavelength near 13 nm, SiC, $SiO_2$, $ZrO_2$, Mo, or the like would be preferably used as the nozzle material since Si, Zr and Mo have relatively high X-ray transmissivities.

The method of ascertaining the position of the nozzle tip or changes in this position may also be modified. For example, the position of the nozzle tip may be measured using a contact needle type sensor as previously described or a non-contact displacement sensor such as a laser displacement sensor. Also, in the described methods, measurements are not performed during the operation of the LPX (i.e., during laser irradiation). Therefore, the operation of the LPX must be temporarily stopped before measurements are performed. However, since the position of the nozzle tip is directly determined by the measuring device, this method offers a simple measuring system.

Thus, in the present invention, position detection of the target material feed-out portion (e.g., nozzle) or changes in the position thereof is provided. Therefore, it is possible to ascertain the extent to which the target material feed-out portion has been abraded by the plasma. Consequently, the state of the target material feed-out part can be constantly monitored.

Furthermore, by moving the target material feed-out portion, the position of the tip end of the target material feed-out portion can be constantly maintained at the initial position. As a result, even if the LPX is operated over a long period of time, the density of the target material at the focal position of the laser light and the position of plasma generation can be constantly maintained in the initial stage, thereby enabling stable generation of X-rays over a long period of time.

Moreover, since confirmation of the appropriate position for the target material feed-out portion is easy, the target material feed-out portion can be immediately held in the specified position even when the target material feed-out portion is replaced. Accordingly, the time required for replacement can be reduced, thereby improving the operating efficiency of the apparatus.

It will be apparent to those skilled in the art that various modifications and variations can be made in the X-ray irradiation apparatus and X-ray generation position detector of the present invention without departing from the spirit or scope of the invention. Thus, it is intended that the present invention cover the modifications and variations of this invention provided they come within the scope of the appended claims and their equivalents.

What is claimed is:

1. An x-ray irradiation apparatus, comprising
   a target material feed-out device to provide a target material to a specified target position;
   a laser to irradiate the specified target position with laser light so that the target material forms a plasma that emits x-rays; and
   an x-ray generation position control device to determine and control a position of x-ray generation,
   wherein the x-ray generation position control device includes an x-ray generation position detector to detect the position of x-ray generation and a target material moving device to alter the position of the target material feed-out device so that the specified target position is maintained.

2. The x-ray irradiation apparatus according to claim 1, wherein the x-ray generation position detector includes a two-dimensional detector sensitive to one of x-rays, ultraviolet, and visible-light.

3. The x-ray irradiation apparatus according to claim 1, wherein the x-ray generation position detector is located substantially on a light path of x-rays to an object of irradiation.

4. The x-ray irradiation apparatus according to claim 1, wherein the x-ray-generation position detector measures x-ray intensity.

5. The x-ray irradiation apparatus according to claim 1, wherein the x-ray generation position detector selects an x-ray wavelength or wavelength region to be utilized.

6. The x-ray irradiation apparatus according to claim 1, wherein the x-ray generation position detector includes a pair of conductors defining openings in the centers thereof, a photoelectric effect occurring when the position of x-ray generation has moved from the specified target position and one of the pair of conductors is irradiated.

7. The x-ray irradiation apparatus according to claim 6, wherein at least one of the pair of conductors is split into a plurality of parts.

8. The x-ray irradiation apparatus according to claim 1, further comprising a sample holder to hold an object to be irradiated with the x-rays.

9. The x-ray irradiation apparatus according to claim 1, further comprising a vacuum vessel, the position of x-ray generation being disposed inside the vacuum vessel.

10. An X-ray irradiation apparatus, comprising:
a target material feed-out device to provide a target material to a specified target position;
a laser to irradiate the specified target position with laser light so that the target material forms a plasma that emits x-rays; and
an x-ray generation position control device to determine and control a position of x-ray generation,
wherein the x-ray generation position control device includes an x-ray generation position detector to detect the position of x-ray generation and a laser irradiation position control device to alter the position of laser light irradiation on the target material so that the specified target position is maintained.

11. The x-ray irradiation apparatus according to claim 10, wherein the x-ray generation position detector includes a two-dimensional detector sensitive to one of x-rays, ultraviolet, and visible-light.

12. The x-ray irradiation apparatus according to claim 10, wherein the x-ray generation position detector is located substantially on a light path of x-rays to an object of irradiation.

13. The x-ray irradiation apparatus according to claim 10, wherein the x-ray generation position detector measures x-ray intensity.

14. The x-ray irradiation apparatus according to claim 10, wherein the x-ray generation position detector selects an x-ray wavelength or wavelength region to be utilized.

15. The x-ray irradiation apparatus according to claim 10, wherein the x-ray generation position detector including a pair of conductors defining openings in the centers thereof, a photoelectric effect occurring when the position of x-ray generation has moved from the specified target position and one of the pair of conductors is irradiated.

16. The x-ray irradiation apparatus according to claim 15, wherein at least one of the pair of conductors is split into a plurality of parts.

17. The x-ray irradiation apparatus according to claim 10, further comprising a sample holder to hold an object to be irradiated with the x-rays.

18. The x-ray irradiation apparatus according to claim 10, further comprising a vacuum vessel, the position of x-ray generation being disposed inside the vacuum vessel.

19. An x-ray irradiation apparatus, comprising:
a target material feed-out device to provide a target material in a feed-out direction to a specified target position;
a laser to provide laser light to the specified target position, the laser light causing the target material to emit x-rays; and
a rotary mechanism operatively connected to the target material feed-out device to axially rotate the target material feed-out device about the feed-out direction.

20. The x-ray irradiation apparatus according to claim 19, further comprising a position measuring system to measure the position of the target material feed-out device.

21. The x-ray irradiation apparatus according to claim 20, further comprising a moving mechanism to move the target material feed-out device according to measurements of the position measuring system so that a position of the target material feed-out device is maintained.

22. The x-ray irradiation apparatus according to claim 19, further comprising an x-ray generation position measuring system to measure a position of x-ray generation.

23. The x-ray irradiation apparatus according to claim 22, further comprising a moving mechanism to move the target material feed-out device according to measurements of the x-ray generation position measuring system so that a position of the target material feed-out device is maintained.

24. The x-ray irradiation apparatus according to claim 19, wherein the target material feed-out device includes a nozzle.

25. The x-ray irradiation apparatus according to claim 19, wherein the laser light includes pulsed laser light.

26. An x-ray irradiation apparatus, comprising:
a target material feed-out device to provide a target material in a feed-out direction to a specified target position;
a laser to provide laser light to the specified target position, the laser light causing the target material to emit x-rays;
a target feed-out control device to detect and control the position of the target material feed-out device; and
a moving mechanism operatively connected to the target material feed-out device to move the target material feed-out device so that the position of one of the target material feed-out device or a tip of the target material feed-out device is maintained at a specified position.

27. The x-ray irradiation apparatus according to claim 26, wherein the moving mechanism includes a stage.

28. The x-ray irradiation apparatus according to claim 26, wherein the target material feed-out device includes a nozzle.

29. The x-ray irradiation apparatus according to claim 26, wherein the laser light includes pulsed laser light.

30. An x-ray irradiation apparatus, comprising:
a target material feed-out device to provide a target material in a feed-out direction to a specified target position;
a laser to provide laser light to the specified target position, the laser light causing the target material to emit x-rays; and
a target feed-out control device to detect and control the position of the target material feed-out device,
wherein the target feed-out control device includes at least one of a contact detection system or non-contact detection system.

31. The x-ray irradiation apparatus according to claim 30, wherein the target material feed-out device includes a nozzle.

32. The x-ray irradiation apparatus according to claim 30, wherein the laser light includes pulsed laser light.

33. An x-ray exposure apparatus for exposing a mask pattern of a mask onto a substrate, the x-ray exposure apparatus comprising:
a target material feed-out device to provide a target material in a feed-out direction to a specified target position;

a laser to provide laser light to the specified target position, the laser light causing the target material to emit x-rays;

a rotary mechanism operatively connected to the target material feed-out device to axially rotate the target material feed-out device about the feed-out direction; and an x-ray optical system to direct the x-rays to the substrate via the mask such that the mask pattern is exposed onto the substrate.

34. An x-ray exposure apparatus for exposing a mask pattern of a mask onto a substrate, the x-ray exposure apparatus comprising:

a target material feed-out device to provide a target material in a feed-out direction to a specified target position;

a laser to provide laser light to the specified target position, the laser light causing the target material to emit x-rays;

a target feed-out control device to detect and control the position of the target material feed-out device; and an x-ray optical system to direct the x-rays to the substrate via the mask such that the mask pattern is exposed onto the substrate.

* * * * *